(12) United States Patent
Moon et al.

(10) Patent No.: US 8,729,622 B2
(45) Date of Patent: May 20, 2014

(54) THREE DIMENSIONAL SEMICONDUCTOR MEMORY DEVICES AND METHODS OF FABRICATING THE SAME

(75) Inventors: Hui-Chang Moon, Yongin-si (KR); Sung-Min Hwang, Seoul (KR); Woonkyung Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 190 days.

(21) Appl. No.: 13/276,682

(22) Filed: Oct. 19, 2011

(65) Prior Publication Data

US 2012/0098049 A1 Apr. 26, 2012

(30) Foreign Application Priority Data

Oct. 20, 2010 (KR) ........................ 10-2010-0102559

(51) Int. Cl.
*H01L 29/792* (2006.01)

(52) U.S. Cl.
USPC ................ 257/324; 257/E29.309; 438/197; 365/103

(58) Field of Classification Search
USPC ................................ 257/314, 315, 324, 326, 257/E21.645–E21.694, 21.677, E21.679, 257/E27.026, E29.309, E21.68; 365/94, 365/103–105, 189.04; 438/197, 592, 618, 438/605, 593, 622, 598
See application file for complete search history.

(56) References Cited

U.S. PATENT DOCUMENTS

| 7,696,559 B2 | 4/2010 | Arai et al. |
| 7,956,408 B2 | 6/2011 | Enda et al. |
| 2009/0001419 A1 | 1/2009 | Han et al. |

FOREIGN PATENT DOCUMENTS

| JP | 2007-180389 A | 7/2007 |
| KR | 10-2008-00070583 A | 7/2008 |
| KR | 10-0855990 | 8/2008 |

*Primary Examiner* — Sonya D McCall Shepard
(74) *Attorney, Agent, or Firm* — Lee & Morse, P.C.

(57) ABSTRACT

A three dimensional semiconductor memory device has a stacked structure including cell gates stacked therein that are insulated from each other and first string selection gates laterally separated from each other, vertical active patterns extending through the first string selection gates, multi-layered dielectric layers between sidewalls of the vertical active patterns and the cell gates and between the sidewalls of the vertical active patterns and the first string selection gates, and at least one first supplement conductive pattern. The first string selection gates are disposed over an uppermost cell gate of the cell gates. Each vertical active pattern extends through each of the cell gates stacked under the first string selection gates. The first supplement conductive pattern is in contact with a sidewall of one of the first string selection gates.

15 Claims, 25 Drawing Sheets

Fig. 7

Successively patterning an insulating pattern and a preliminary string selection gate to form a cutting trench and string selection gates being laterally separated from each other, wherein a laterally recessed region is formed at each inner sidewall of the cutting trench ~S200

Performing a selective growth process using the string selection gates exposed by the recessed regions as seed layers to form supplement conductive patterns ~S210

THREE DIMENSIONAL SEMICONDUCTOR MEMORY DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2010-0102559, filed on Oct. 20, 2010, and entitled "Three Dimensional Semiconductor Memory Devices and Methods of Fabricating the Same," the entirety of which is incorporated by reference herein.

BACKGROUND

Semiconductor devices are very attractive in an electronic industry because of small size, multi-function and/or low fabrication cost thereof. High performance semiconductor devices and/or low cost semiconductor devices have been increasingly demanded with the development of the electronic industry. The semiconductor devices have been more highly integrated in order to meet the above demands.

SUMMARY

Embodiments may be realized by providing a three dimensional semiconductor memory device having a stacked structure including cell gates stacked therein that are insulated from each other and first string selection gates laterally separated from each other, and the first string selection gates are disposed over an uppermost cell gate of the cell gates. The device also includes vertical active patterns extending through the first string selection gates, and each vertical active pattern extends through each of the cell gates stacked under the first string selection gates. The device further includes multi-layered dielectric layers between sidewalls of the vertical active patterns and the cell gates and between the sidewalls of the vertical active patterns and the first string selection gates, at least one first supplement conductive pattern, and the first supplement conductive pattern is in contact with a sidewall of one of the first string selection gates.

The first supplement conductive pattern may include a metal pattern and a barrier pattern between the metal pattern and the sidewall of the one of the first string selection gates. The sidewall of the one of the first string selection gates may be laterally concave. A top end of the first supplement conductive pattern may be at a level equal to or lower than a top surface of the one of the first string selection gates, and a bottom end of the first supplement conductive pattern may be at a level equal to or higher than a bottom surface of the one of the first string selection gates.

The device may include a pair of device isolation patterns disposed at opposing sides of the stacked structure. Opposing sidewalls of each of the cell gates may be in contact with respective ones of the pair of device isolation patterns, and the sidewall of the one of the first string selection gates may contact the first supplement conductive pattern and an opposing sidewall of the one of the first string selection gates may contact one of the pair of device isolation patterns.

The device may include second string selection gates between the first string selection gates and the uppermost cell gate, and at least one second supplement conductive pattern. The second supplement conductive pattern may be in contact with a sidewall of one of the second string selection gates. The vertical active patterns may penetrate the first and second string selection gates, the cell gates may be stacked under the second string selection gates, and the multi-layered dielectric layers may be between the sidewalls of the vertical active patterns and the second string selection gates. A top end of the second supplement conductive pattern may be at a level equal to or lower than a top surface of the one of the second string selection gates, and a bottom end of the second supplement conductive pattern may be at a level equal to or higher than a bottom surface of the one of the second string selection gates. The first and second supplement conductive patterns may be connected to each other and may be insulated from other first and second supplement conductive patterns contacting neighboring ones of the first and second string selection gates.

Each of the multi-layered dielectric layers may include a tunnel dielectric layer, a charge storage layer, and a blocking dielectric layer. Portions of the multi-layered dielectric layers may extend laterally to cover bottom and top surfaces of the cell gates and the first string selection gates. The stacked structure may include at least one ground selection gate between a substrate and a lowermost cell gate of the cell gates. The vertical active patterns may extend downwardly to penetrate the at least one ground selection gate. The multi-layered dielectric layers may be between the sidewalls of the vertical active patterns and the at least one ground selection gate.

Embodiments may also be realized by providing a method of fabricating a three dimensional semiconductor memory that includes forming gate patterns and insulating patterns alternately stacked on a substrate, and the gate patterns include a plurality of cell gates and a first preliminary string selection gate on an uppermost cell gate of the cell gates. The method includes forming vertical active patterns penetrating the gate patterns and the insulating patterns, forming multi-layered dielectric layers between sidewalls of the vertical active patterns and the gate patterns, forming a cutting trench penetrating the first preliminary string selection gate and ones of the insulating patterns on the first preliminary string selection gate to form the first string selection gates laterally separated from each other by the cutting trench, and forming first supplement conductive patterns filling the recessed regions, respectively. Inner sidewalls of the first string selection gates are laterally recessed to form recessed regions adjacent to the cutting trench.

Forming the first supplement conductive patterns may include forming a supplement conductive layer on the substrate, the supplement conductive layer filling the recessed regions, and removing the supplement conductive layer outside the recessed regions. Forming the first supplement conductive patterns may include performing a selective growth process on the inner sidewalls of the first string selection gates exposed by the recessed regions as seed layers to form the first supplement conductive patterns.

The method may include forming second supplement conductive patterns. The gate patterns may include a second preliminary string selection gate between the first preliminary string selection gate and the uppermost cell gate. Forming the cutting trench may include forming the cutting trench to penetrate the second preliminary string selection gate and another insulating pattern between the first preliminary string selection gate and the second preliminary string selection gate. The second string selection gate may be formed at opposing sides of the cutting trench and inner sidewalls of the second string selection gates may be laterally recessed to form second recessed regions adjacent to the cutting trench. Forming the second supplement conductive patterns may include filling the second recessed regions.

Forming the first and second supplement conductive patterns may include, after forming the cutting trench, conformally forming a supplement conductive layer filling the recessed regions and the second recessed regions on the substrate, and anisotropically etching the supplement conductive layer until a bottom surface of the cutting trench is exposed to form the first and second supplement conductive patterns. The method may include forming ones of the first and second supplement conductive patterns to fill one of the recessed regions and one of the second recessed regions at one inner sidewall of the cutting trench. The ones of the first and second supplement conductive patterns may be connected to each other. The method may also include forming the ones of the first and second supplement conductive patterns to be separated from other first and second supplement conductive patterns of another inner sidewall of the cutting trench.

Embodiments may also be realized by providing a three dimensional semiconductor memory device having a stacked structure including cell gates and string selection gates, the cell gates are stacked in a first direction and insulated from each other, and one of the string selection gates are spaced apart from another of the string selection gates in a second direction that intersects the first direction. The device has a cutting trench on the cell gates, the cutting trench is between the one of the string selection gates and the other of the string selection gates. The device also includes first supplement conductive patterns and one of the first supplement conductive patterns is between a sidewall of the one of the string selection gates and the cutting trench and another of the first supplement conductive patterns is between a sidewall of the other of the string selection gates and the cutting trench.

The first supplement conductive patterns may be separated from each other. The device may further include vertical active patterns, and one vertical active pattern may extend through the one of the string selection gates and each of the cell gates and another vertical active pattern may extend through the other of the string selection gates and each of the cell gates.

The first supplement conductive patterns may define portions of sidewalls of the cutting trench. The cutting trench may expose an insulating layer above an uppermost cell gate of the cell gates in the stacked structure such that a bottom surface of the cutting trench may be defined by the insulating layer.

BRIEF DESCRIPTION OF THE DRAWINGS

Features will become apparent to those of ordinary skill in the art by describing in detail exemplary embodiments with reference to the attached drawings, in which:

FIG. 7 illustrates a flow chart of an exemplary method of forming a supplement conductive pattern of a three dimensional semiconductor memory device, according to an exemplary embodiment;

DETAILED DESCRIPTION

Figure 1:
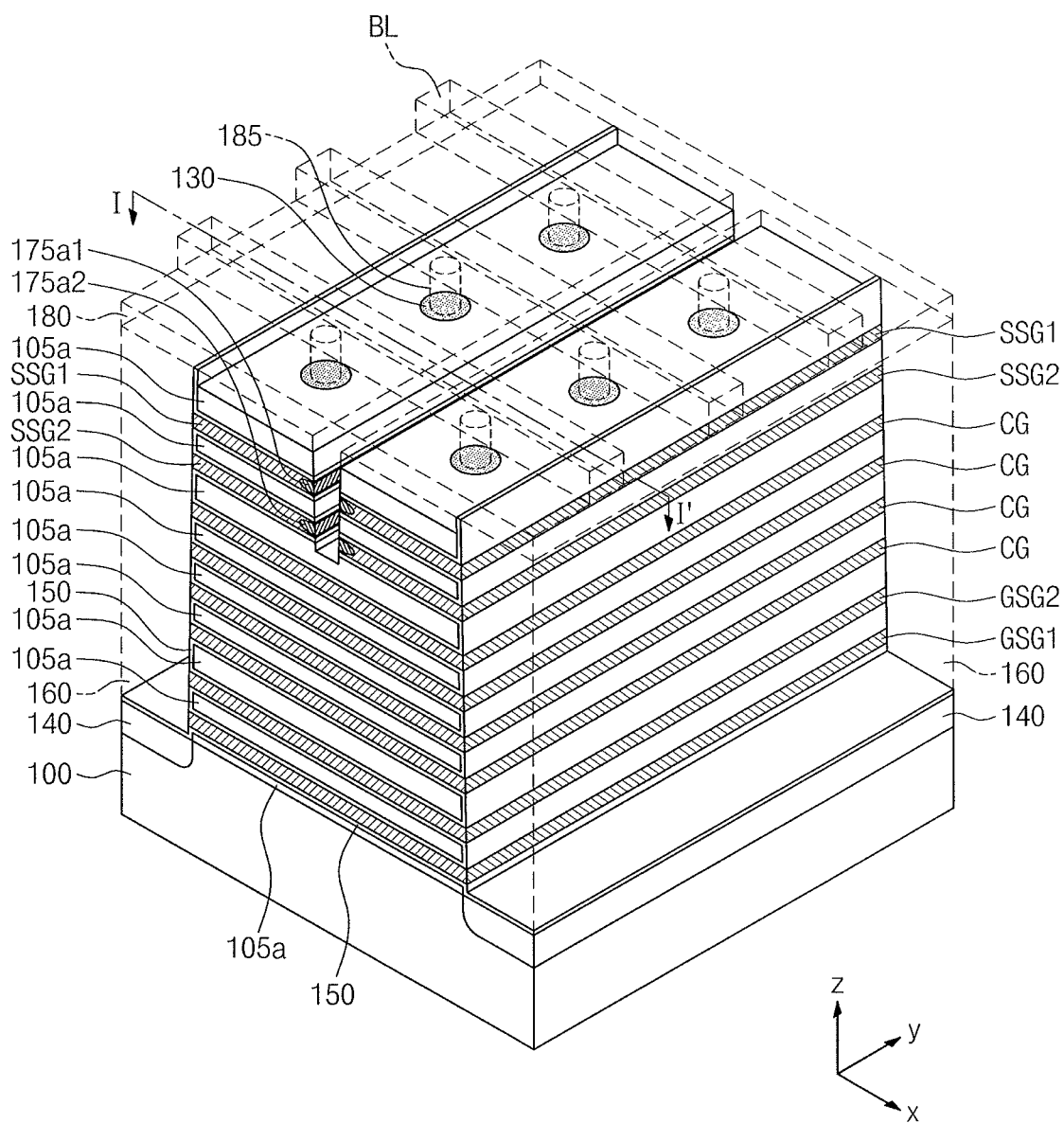
FIG. 1 illustrates a perspective view of a three dimensional semiconductor memory device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be further understood that the terms "comprises", "comprising,", "includes" and/or "including", when used herein, specify the presence of stated features, stages, operations, elements, and/or components, but do not preclude the presence or addition of one or more other features, stages, operations, elements, components, and/or groups thereof.

Figure 2A:
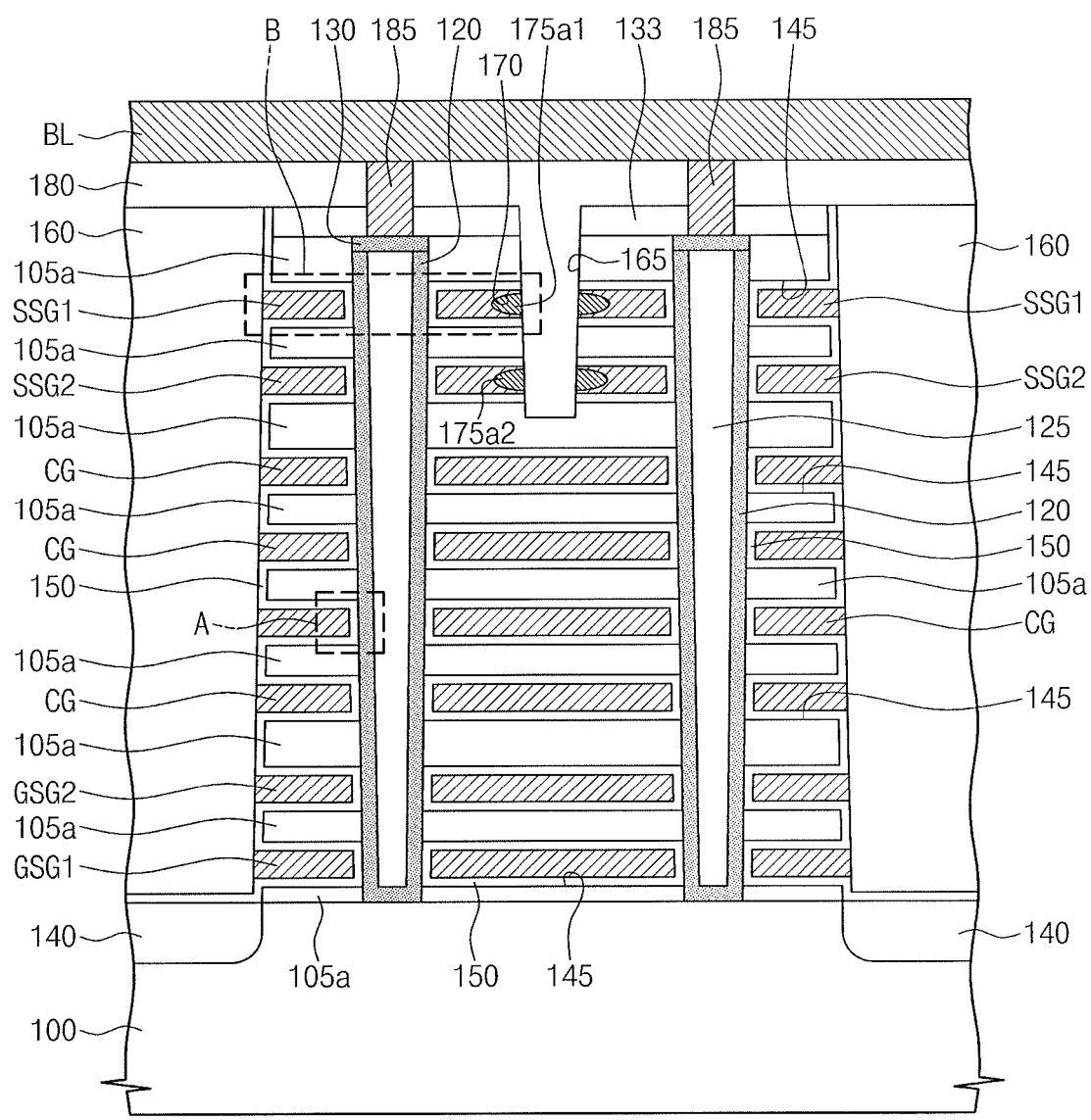
FIG. 2A illustrates a cross sectional view taken along a line I-I' of FIG. 1, according to an exemplary embodiment.
Figure 2B:
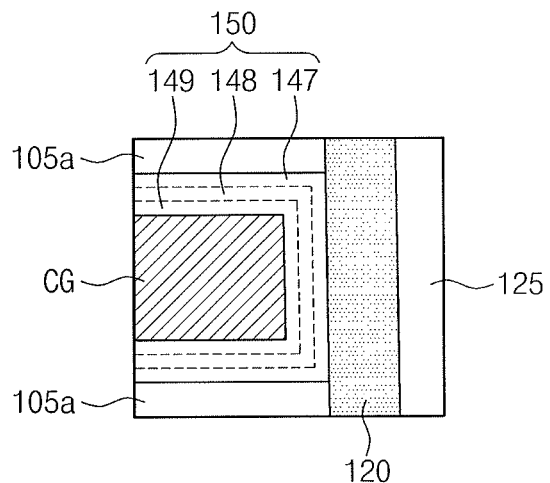
FIG. 2B illustrates an enlarged view of a portion 'A' of FIG. 2A.
Figure 2C:
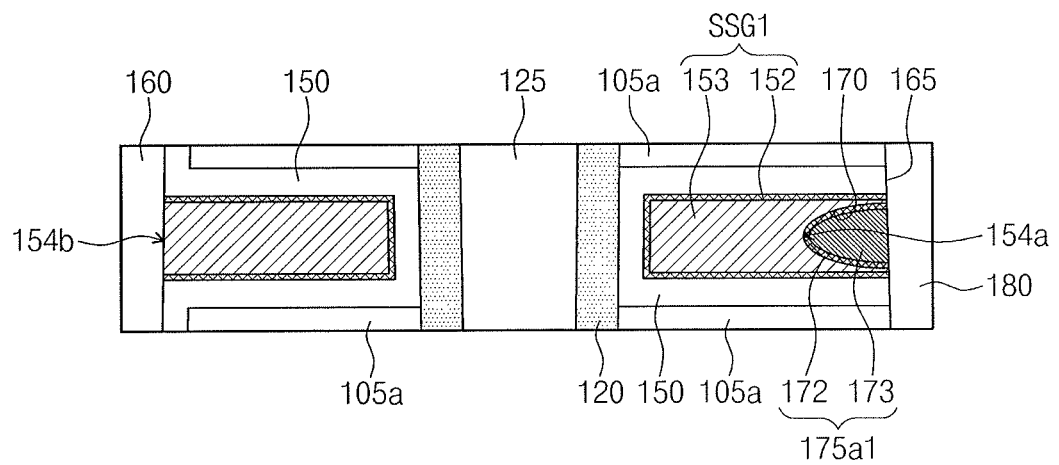
FIG. 2C illustrates an enlarged view of a portion 'B' of FIG. 2A, according to an exemplary embodiment.

FIG. 1 illustrates a perspective view of a three dimensional semiconductor memory device according to an exemplary embodiment. FIG. 2A illustrates a cross sectional view taken along a line I-I' of FIG. 1 according to an exemplary embodiment, and FIG. 2B illustrates an enlarged view of a portion 'A' of FIG. 2A. FIG. 2C illustrates an enlarged view of a portion 'B' of FIG. 2A, according to an exemplary embodiment.

Referring to FIGS. 1 and 2A, a stacked structure may be disposed on a substrate 100. The stacked structure may include insulating patterns 105a and gate patterns, e.g., gate patterns GSG1, GSG2, CG, SSG2, and SSG1, that are alternately and repeatedly stacked in one direction. The gate patterns GSG1, GSG2, CG, SSG2, and SSG1 in the stacked structure may include a plurality of cell gates CG stacked between the GSG2 and SSG2. The gate patterns GSG1, GSG2, CG, SSG2, and SSG1 in the stacked structure may include at least one of ground selection gate GSG1 and GSG2 between the substrate 100 and a lowermost cell gate CG of the cell gates CG. In an exemplary embodiment, two ground selection gates, e.g., GSG1 and GSG2, may be disposed between the substrate 100 and the lowermost cell gate CG. For example, a first ground selection gate GSG1 may be disposed between the substrate 100 and the lowermost cell gate CG, and a second ground selection gate GSG2 may be disposed between the first ground selection gate GSG1 and the lowermost cell gate CG.

The ground selection gates GSG1 and GSG2 and the cell gates CG in the stacked structure may be insulated from each other by, e.g., the insulating patterns 105a. Each of the insulating patterns 105a may include an insulating material, e.g., an oxide, etc. In an exemplary embodiment, two layers, e.g., floors, of the ground selection gates GSG1 and GSG2 may be included in the stacked structure. However, embodiments are not limited thereto. For example, a single floor of a ground selection gate may be disposed between the substrate 100 and the lowermost cell gate CG. Alternatively, three or more floors of ground selection gates may be disposed between the substrate 100 and the lowermost cell gate CG. The cell gates CG, the ground selection gates GSG1 and GSG2, and the insulating patterns 105a between the cell and ground selection gates CG, GSG1, and GSG2 may extend in a first direction. The first direction may correspond to a y-axis direction illustrated in FIG. 1.

The gate patterns GSG1, GSG2, CG, SSG2, and SSG1 in the stacked structure may include a least one first string selection gate SSG1, e.g., a plurality of first string selection gates SSG1 as illustrated in FIG. 1. The first string selection gate SSG1 may be disposed over one uppermost cell gate CG, e.g., so that the cell gates CG and the ground selection gates GSG1 and GSG2 in the stacked structure are under the first string selection gate SSG1. The plurality of first string selection gates SSG1 may be disposed at a same level from a top surface of the substrate 100, e.g., each of the first string selection gates SSG1 may be disposed substantially parallel to each other on a same plane, the same level, and/or a same height from the top surface of the substrate 100. For example, the plurality of first string selection gates SSG1 may be disposed in a same floor. The first string selection gates SSG1 may also extend in the first direction, e.g., the first string selection gates SSG1 may extend substantially parallel to each other in the first direction. The first string selection gates SSG1 may be spaced apart from each other in a second direction perpendicular to the first direction. The second direction may correspond to an x-axis illustrated in FIG. 1.

The first string selection gates SSG1 in the stacked structure may be laterally spaced apart from each other by, e.g., a cutting trench 165. The cutting trench 165 may be disposed between adjacent first string selection gates SSG1 in the stacked structure. The cutting trench 165 may extend in the first direction, e.g., may extend parallel to the adjacent first string selection gates SSG1. The cutting trench 165 may include, e.g., may be defined by, a pair of inner sidewalls extending in the first direction. The pair of inner sidewalls may face each other in the second direction. The pair of the inner sidewalls may be defined by sidewalls of the adjacent first string selection gates SSG1.

The insulating patterns 105a on the first string selection gates SSG1 may be spaced apart from each other by the cutting trench 165. For example, the insulating patterns on the first string selection gates SSG1 may be divided into a plurality of insulating patterns 105a on a same plane, on a same level, and/or at a same height. One sidewall of the insulating patterns 105a on the first string selection gates SSG1 may be included in the pair of inner sidewalls of the cutting trench 165, respectively. For example, the pair of inner sidewalls may be defined by both sidewalls of adjacent insulating patterns 105a and sidewalls of adjacent first string selection gates SSG1, according to an exemplary embodiment.

In an exemplary embodiment, one cutting trench 165 may be disposed over, e.g., above, the uppermost cell gate CG so that the adjacent first string selection gates SSG1 may be disposed over the uppermost cell gate CG. For example, a pair of adjacent first string selection gates SSG1 may both be disposed above and/or may overlap the same uppermost cell gate CG. However, embodiments are not limited thereto. For example, a plurality of the cutting trenches 165 may be disposed over the uppermost cell gate CG so that three or more first string selection gates SSG1 may be disposed above and/or overlap the same uppermost cell gate CG. For example, the plurality of cutting trenches 165 may be may be disposed at the same level and/or at the same height from the substrate 100. Each of the plurality of cutting trenches 165 may be substantially parallel to each along one direction and may be spaced apart from each other along the second direction.

First supplement conductive patterns 175a1 may be in contact with sidewalls of the first string selection gates SSG1, e.g., the first supplement conductive patterns 175a may be directly on the sidewalls of the first string selection gates SSG1 that are adjacent to cutting trench 165. For example, a first supplement conductive pattern 175a1 may be in contact with one sidewall of one of the first string selection gates SSG1 that is adjacent to the cutting trench 165. Each cutting trench 165 may include a pair of first supplement conductive patterns 175a1, which may be separated from each other in the second direction. The first supplement conductive patterns 175a1 may each contact one of the adjacent first string selection gates SSG1 so the first supplement conductive patterns 175a1 are laterally separated from each other in the second direction. As illustrated in FIG. 1, each of the first supplement conductive patterns 175a1 and the corresponding sidewalls of the first string selection gates SSG1 contacting the first supplement conductive patterns 175a1 may extend in the first direction. The first supplement conductive pattern 175a1 will be described in more detail later.

In an exemplary embodiment, a second string selection gate SSG2 may be disposed under each of the first string selection gates SSG1. A number of second string selection gates SSG2 may correspond to a number of the first string selection gates SSG1 so that each second string selection gates SSG2 overlaps, e.g., completely overlaps, one of the first string selection gates SSG1. Each of the second string selection gates SSG2 may be disposed between one, e.g., only one, of the first selection gates SSG1 and the uppermost cell gate CG. Each of the second string selection gates SSG2 may overlap, e.g., completely overlap, the one uppermost cell gate CG.

The second string selection gates SSG2 may be disposed at same level, in a same plane, and/or at a same height from the top surface of the substrate 100. For example, the second string selection gates SSG2 may be disposed in a same floor of, e.g., the stacked structure. The second string selection gates SSG2 may be laterally separated from each other. For example, adjacent second string selection gates SSG2 in the stacked structure may also be laterally separated from each other by the cutting trench 165. That is, the cutting trench 165 may also be disposed between the adjacent second string selection gates SSG2 in the stacked structure.

At least one of the insulating patterns 105a directly on the second string selection gates SSG2 may also be laterally separated from each other by the cutting trench 165. For example, the insulating patterns 105a between the second string selection gates SSG2 and the first string selection gates SSG1 may be laterally separated by the cutting trench 165. An insulating pattern 105a between the second string selection gates SSG2 and the uppermost most cell gate CG may not be laterally separated, e.g., may be a continuous layer under the second string selection gate SSG2. The cutting trench 165 may form a recess, e.g., aperture, in an upper portion of the insulating pattern 105a between the second string selection gates SSG2 and the uppermost most cell gate CG. Ones of the sidewalls of the insulating patterns 105a directly on the second string selection gates SSG2 may be included in the pair of inner sidewalls of the cutting trench 165. For example, the ones of the sidewalls of the insulating patterns 105a may define portions of the sidewalls of the cutting trench 165.

Second supplement conductive patterns 175a2 may be in contact with sidewalls of the second string selection gates SSG2, e.g., the second supplement conductive patterns 175a2 may be directly on the sidewalls of the second string selection gates SSG2 that are adjacent to the cutting trench 165. For example, a second supplement conductive pattern 175a2 may be in contact with one sidewall of one of the second string selection gates SSG2 that is adjacent to the cutting trench 165. Each cutting trench 165 may include a pair of second supplement conductive patterns 175a2, which may be separated from each other in the second direction. As illustrated in FIG. 1, each of the second supplement conductive patterns 175a2 and the corresponding sidewalls of the second string selection gates SSG2 may also extend in the first direction. The second supplement conductive pattern 175a2 will be described in more detail later.

According to an exemplary embodiment, the second and first string selection gates SSG2 and SSG1 may be sequentially stacked on the uppermost cell gate CG. However, embodiments are not limited thereto. For example, the second string selection gate SSG2 may be omitted. Alternatively, three or more floors of string selection gates may be stacked on the uppermost cell gate CG and corresponding supplement conductive patterns may be in contact with sidewalls of each of the three or more floors of string selection gates separated by a cutting trench.

As illustrated in FIG. 2A, vertical active patterns 120 may vertically penetrate the stacked structure to be connected to the substrate 100. The vertical active patterns 130 may be disposed in through holes that extend through the stacked structure to expose the substrate 100. The vertical active patterns 120 may be connected to, e.g., a well region formed in the substrate 100. The well region may be doped with dopants of a first conductivity type. Each of the vertical active patterns 120 may successively penetrate, e.g., be disposed on sidewalls of, each of the first string selection gate SSG1, the second string selection gate SSG2 thereunder, the stacked cell gates CG, and the ground selection gates GSG2 and GSG1. A plurality of the vertical active patterns 120 may penetrate the stacked structure, which may include the first string selection gates SSG1 and the gates SSG2, CG, GSG2, and GSG1 thereunder. The plurality of vertical active patterns 120 may be spaced apart and adjacent vertical active patterns 120 may have at least one cutting edge 165 therebetween.

The vertical active pattern 120 may have, e.g., a pipe shape or a macaroni shape with an inside empty space. A bottom end of the pipe shape or macaroni shape may be closed. For example, the vertical active pattern 120 may cover, e.g., completely cover, a bottom surface of the through holes in the stacked structure such that the vertical active pattern 120 is directly on the substrate. An inner space surrounded by the vertical active pattern 120 may be filled with, e.g., a filling insulating pattern 125. A capping semiconductor pattern 130 may be disposed on the filling insulating pattern 125 and the vertical active pattern 120. The capping semiconductor pattern 130 may be in contact with ends of the vertical active pattern 120.

The vertical active pattern 120 may be formed of e.g., the same semiconductor material as the substrate 100. The capping semiconductor pattern 130 may be formed of the same semiconductor material as, e.g., the vertical active pattern 120. For example, the substrate 100 may be a silicon substrate, and the vertical active pattern 120 and the capping semiconductor pattern 130 may include silicon. The vertical active pattern 120 and the capping semiconductor pattern 130 may be crystalline state. The vertical active pattern 120 may be undoped or may be doped with dopants of the first conductivity type. At least a portion of the capping semiconductor pattern 130 may be doped with dopants of a second conductivity type. The capping semiconductor pattern 130 doped with dopants of the second conductivity type may correspond to a drain. In an exemplary embodiment, the drain may be formed in the capping semiconductor pattern 130 and a portion of the vertical active pattern 120. A bottom end of the drain may be located, e.g., at a level adjacent to a top surface of the first string selection gate SSG1. In an exemplary embodiment, the vertical active pattern 120 may have a pillar shape in the through-hole, and the capping semiconductor pattern 130 and the filling insulating pattern 125 may be omitted. Accordingly, the drain may be formed in an upper portion of the vertical active pattern 120.

A dielectric layer 150, e.g., a multi-layered dielectric pattern 150, may be disposed between a sidewall of each of the vertical active pattern 120 and the gate patterns GSG1, GSG2, CG, SSG2, and SSG1. The multi-layered dielectric layer 150 will be described with reference to FIG. 2B in more detail.

Referring to FIGS. 2A and 2B, the multi-layered dielectric layer 150 may include a tunnel dielectric layer 147, a charge storage layer 148, and a blocking dielectric layer 149. The tunnel dielectric layer 147 may be adjacent to, e.g., portions thereof may be directly on, the vertical active pattern 120. The blocking dielectric layer 149 may be adjacent to each of the gate patterns GSG1, GSG2, CG, SSG2, and SSG1, e.g., portions thereof may be directly on the gate patterns GSG1, GSG2, CG, SSG2, and SSG1. The charge storage layer 148 may be disposed between the tunnel dielectric layer 147 and the blocking dielectric layer 149.

The tunnel dielectric layer 147 may be single-layered or multi-layered. The tunnel dielectric layer 147 may include, e.g., an oxide layer and/or an oxynitride layer, etc. The charge storage layer 148 may include, e.g., a dielectric layer having traps that are capable of storing charges. For example, the charge storage layer 148 may include, e.g., a nitride layer and/or a metal oxide layer (e.g., a hafnium oxide layer). The charge storage layer 148 may be single-layered or multi-layered. The blocking dielectric layer 149 may include, e.g., a high-k dielectric layer having a dielectric constant that is higher than that of the tunnel dielectric layer 147. For example, the high-k dielectric layer may include, e.g., a metal oxide layer such as a hafnium oxide layer and/or an aluminum oxide layer. The blocking dielectric layer 149 may further include a barrier dielectric layer having, e.g., an energy band gap that is greater than an energy band gap of the high-k dielectric layer. For example, the barrier dielectric layer may be, e.g., an oxide layer. The barrier dielectric layer may be disposed between the high-k dielectric layer and the charge storage layer 148. An entire portion of the multi-layered dielectric layer 150 may extend to cover top and bottom surfaces of each of the gate patterns GSG1, GSG2, CG, SSG2, and SSG1, according to an exemplary embodiment.

Each of the vertical active patterns 120 and the electrodes GSG1, GSG2, CG, SSG2, and SSG1 adjacent thereto may constitute a single vertical cell string. The vertical cell string may include a plurality of cell transistors that are serially connected to each other. The vertical cell string may further include, e.g., at least one ground selection transistor and at least one string selection transistor. The at least one ground selection transistor may be serially connected to one end of the serially connected cell transistors, and the at least one string selection transistor may be serially connected to the other end of the serially connected cell transistors. For example, the first and second ground selection transistors may be serially connected to a bottom end of the stacked cell transistors, and first and second string selection transistors may be serially connected to a top end of the stacked cell transistors The cell transistors may be defined at intersections of the vertical active patterns 120 and the cell gates CG, respectively. The ground selection transistors may be defined at intersections of the vertical active patterns 120 and the ground selection gates GSG1 and GSG2, respectively. The string selection transistors may be defined at intersections of the vertical active patterns 120 and the string selection gates SSG1 and SSG2, respectively. The ground selection, cell, string selection transistors in the vertical cell string may be sequentially stacked. The ground selection, cell, string selection transistors in the vertical cell string may include, e.g., channel regions defined at the sidewall of each of the vertical active patterns 120.

A pair of device isolation patterns 160 may be disposed at both sides of the stacked structure, e.g., as illustrated in FIGS. 1 and 2A. For example, the stacked structure may be disposed between the pair of device isolation patterns 160. Both sidewalls of each of the cell gates CG and the ground selection gates GSG1 and GSG2 may be in contact with, e.g., directly on, the pair of device isolation patterns 160, respectively. In an exemplary embodiment, a plurality of the stacked structures may be disposed on the substrate 100, and the device isolation patterns 160 may be disposed between adjacent ones of the plurality of the stacked structures.

A first interlayer dielectric layer 133 may be disposed on the insulating pattern 105a that is on, e.g., directly on, the first string selection gate SSG1. For example, a top surface of the device isolation pattern 160 may be substantially coplanar with a top surface of the first interlayer dielectric layer 133. The cutting trench 165 may extend upwardly to penetrate the first interlayer dielectric layer 133. As such, the first interlayer dielectric layer 133 may include a plurality of first interlayer dielectric layers 133 that are spaced apart by cutting trenches 165. Further, sidewalls of adjacent first interlayer dielectric layers 133 may define an uppermost portion of the sidewalls of the cutting trench 165 therebetween.

A second interlayer dielectric layer 180 may be disposed on, e.g., directly on, the first interlayer dielectric layer 133 and the device isolation pattern 160. The second interlayer dielectric layer 180 may be a continuous layer covering the plurality of first interlayer dielectric layers 133 and the device isolation pattern 160. The second interlayer dielectric layer may fill, e.g., completely fill, the cutting trench 165. The device isolation pattern 160 may include, e.g., oxide, nitride and/or oxynitride. The first interlayer dielectric layer 133 may include, e.g., oxide, nitride and/or oxynitride. The second interlayer dielectric layer 180 may include, e.g., oxide, nitride and/or oxynitride.

Bit lines BL may be disposed parallel to each other on the second interlayer dielectric layer 180. The bit lines BL may extend in the second direction to, e.g., cross over the first string selection gates SSG1. Each of the bit lines BL may be electrically connected to top ends of the vertical active patterns 120 arranged in the second direction. The bit line BL may be electrically connected to the top end (e.g. the drain formed in the upper portion of the vertical active pattern 120) of the vertical pattern 120 through, e.g., a contact plug 185. The contact plug 185 may successively penetrate the second and first interlayer dielectric layers 180 and 133 to be connected to the capping semiconductor pattern 130 on the vertical active pattern 120. The bit lines BL may include metal, e.g., aluminum, tungsten, and/or copper. The contact plug 185 may include metal, e.g., aluminum, tungsten, and/or copper.

A common source region 140 may be disposed in the substrate 100 under each of the device isolation patterns 160. The common source region 140 may be doped with dopants of the second conductivity type. One of the dopant of the first conductivity type and the dopant of the second conductivity type may be an n-type dopant and another of the dopant of the first conductivity type and the dopant of the second conductivity type may be a p-type dopant.

The first ground selection gate GSG1 may control a first channel region defined at the sidewall of the vertical active pattern 120 and a second channel region defined at the substrate 100 under the first ground selection gate GSG1, according to an exemplary embodiment. If an operation voltage is applied to the first ground selection gate GSG1, channels may be generated in the first and second channel regions, so that channels of the cell transistors may be electrically connected to the common source region 140.

The first supplement conductive pattern 175a1 will be described with reference to FIG. 2C in more detail.

Referring to FIG. 2C, the first string selection gate SSG1 may include a first sidewall 154a and a second sidewall 154b that oppose each other. The first sidewall 154a of the first string selection gate SSG1 may be adjacent to the cutting trench 165 and the second sidewall 154b of the first string selection gate SSG1 may be adjacent to the device isolation pattern 160. The first supplement conductive pattern 175a1 may be in contact with, e.g., directly on, the first sidewall 154a of the first string selection gate SSG1. The second sidewall 154b of the first string selection gate SSG1 may be in contact with, e.g., directly on, the device isolation pattern 160.

According to an exemplary embodiment, the first sidewall 154a of the first string selection gate SSG1 may be laterally concave, e.g., along the second direction. A recessed region 170 may be defined between the insulating patterns 105a that are disposed directly above and directly under the first string selection gates SSG1, respectively. The first string selection gate SSG1 may have a void therein that surrounds the recessed region 170. The first supplement conductive pattern 175a1 may fill, e.g., completely fill, the recessed region 170 beside the first string selection gate SSG1 and may be in contact with the concave first sidewall 154a.

The first string selection gate SSG1 may include, e.g., a metal. For example, the first string selection gate SSG1 may include a first barrier pattern 152 and a first metal pattern 153 therein. The first barrier pattern 152 may be disposed between the multi-layered dielectric layer 150 and the first metal pattern 153. The first metal pattern 153 may be surrounded by the first barrier pattern 152. For example, the first barrier pattern 152 may form outer sides of the first string selection gate SSG1. The first barrier pattern 152 may include, e.g., a conductive metal nitride such as titanium nitride (TiN), tantalum nitride (TaN), tungsten nitride (WN), and/or titanium-silicon nitride. The first barrier pattern 152 may further include a transition metal, e.g. titanium (Ti) or tantalum (Ta). The first metal pattern 153 may include a metal, e.g., tungsten, aluminum, or copper.

A top end of the first supplement conductive pattern 175a1 may be disposed at a level and/or height equal to or lower than that of the top surface of the first string selection gate SSG1. A bottom end of the first supplement conductive pattern 175a1 may be disposed a level and/or height equal to or higher than that of the bottom surface of the first string selection gate SSG1. For example, the top end of the first supplement conductive pattern 175a1 may be disposed at a level lower than that of the top surface of the first string selection gate SSG1 and the bottom end of the first supplement conductive pattern 175a1 may be disposed at a level higher than that of the bottom surface of the first string selection gate SSG1, e.g., as illustrated in FIG. 2C. However, embodiments are not limited thereto.

The first supplement conductive pattern 175a1 may include, e.g., a metal. In an exemplary embodiment, the first supplement conductive pattern 175a1 may include a second barrier pattern 172 and a second metal pattern 173. The second barrier pattern 172 may be disposed between the first sidewall 154a of the first string selection gate SSG1 and the second metal pattern 173. For example, outer surfaces of the second metal pattern 173 may be defined by the second barrier pattern 172. The second barrier pattern 172 of the first supplement conductive pattern 175a1 may be in contact with, e.g., directly on, the first sidewall 154a of the first string selection gate SSG1. An interface between the first supplement conductive pattern 175a1 and the first string selection gate SSG1 may exist. The second barrier pattern 172 may include a conductive metal nitride, e.g., titanium nitride (TiN), tantalum nitride (TaN), tungsten nitride (WN), and/or titanium-silicon nitride. Additionally, the second barrier pattern 172 may further include a transition metal, e.g., titanium (Ti) or tantalum (Ta). The second metal pattern 173 may include tungsten, aluminum, or copper. In an embodiment, the second metal pattern 173 may include the same metal as the first metal pattern 153. Alternatively, the second metal pattern 173 may include a different metal from the first metal pattern 153. The second barrier pattern 172 may include the same conductive metal nitride as or a different conductive metal nitride from the first barrier pattern 152.

In the above exemplary embodiment, the first string selection gate SSG1 may include a metal. However, embodiments are not limited thereto. For example, the first string selection gate SSG1 may include a semiconductor material doped with dopants.

Referring to FIGS. 2A and 2C, the cell gates CG, the ground selection gates GSG1 and GSG2, and the second string selection gate SSG2 may include the same conductive material as the first string selection gate SSG1.

One sidewall of the second string selection gate SSG2, which may be in contact with the second supplement conductive pattern 175a2, may be laterally concave like the first sidewall 154a of the first string selection gate SSG1. The second supplement conductive pattern 175a2 may have substantially the same shape and structure as the first supplement conductive pattern 175a1 and/or may be formed of the same conductive material as the first supplement conductive pattern 175a1. For example, a top end of the second supplement conductive pattern 175a2 may be disposed at a level equal to or lower than that of the top surface of the second string selection gate SSG2, and a bottom end of the second supplement conductive pattern 175a2 may be disposed at a level equal to or higher than that of the bottom surface of the second string selection gate SSG2. A barrier pattern in the second supplement conductive pattern 175a2 may be disposed between the one sidewall of the second string selection gate SSG2 and a metal pattern in the second supplement conductive pattern 175a2.

According to the three dimensional semiconductor memory device described above, the supplement conductive patterns 175a1 and 175a2 may be in contact with the sidewalls of the string selection gates SSG1 and SSG2, respectively. Thus, the string selection gates SSG1 and SSG2 may have sufficient widths to reduce resistances of the string selection gates SSG1 and SSG2. As a result, it may be possible to, e.g., improve reliability of the three dimensional semiconductor memory device and/or to increase operation speed of the three dimensional semiconductor memory device.

Sidewalls of the string selection gates SSG1 and SSG2 that are adjacent to the cutting trench 165 may be laterally recessed to define recessed regions 170. In this case, widths, e.g., as defined in the second direction, of the string selection gates SSG1 and SSG2 may be reduced to, e.g., increase resistances of the string selection gate SSG1 and SSG2. In contrast, according to an exemplary embodiment, the supplement conductive patterns 175a1 and 175a2 may be in contact with the sidewalls of the string selection gates SSG1 and SSG2, and resistances of the string selection gates SSG1 and SSG2 may be minimized. Accordingly, the three dimensional semiconductor memory device may have improved reliability and/or high integration.

Figure 2D:
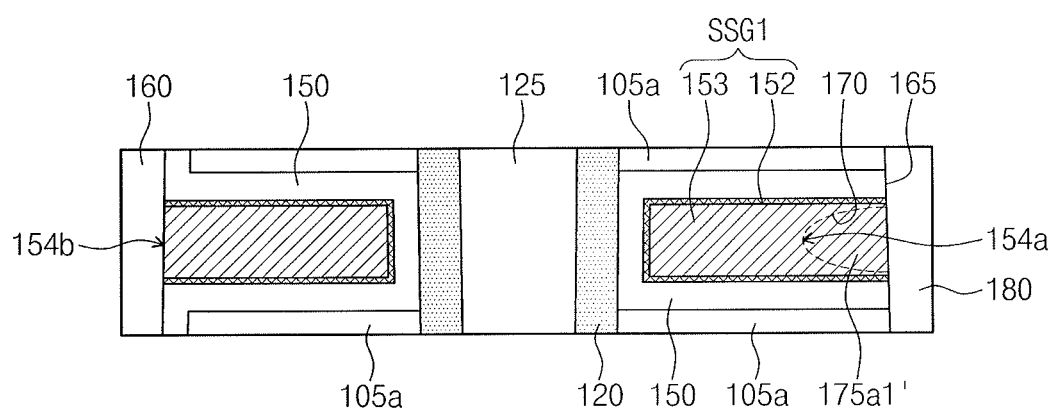
FIG. 2D illustrates an enlarged view of a portion 'B' of FIG. 2A, according to another exemplary embodiment.

In an exemplary embodiment, the barrier patterns of the supplement conductive pattern may be omitted. This will be described with reference to FIG. 2D. FIG. 2D illustrates an enlarged view of a portion 'B' of FIG. 2A according to another exemplary embodiment.

Referring to FIG. 2D, a first supplement conductive pattern 175a1' may contact, be directly on, the first sidewall 154a of the first string selection gate SSG1. The first supplement conductive pattern 175a1' may include, e.g., a metal. The first supplement conductive pattern 175a1' may not include a barrier pattern. The first supplement conductive pattern 175a1' may include the same metal as the first metal pattern 153 in the first string selection gate SSG1. The metal in the first supplement conductive pattern 175a1' may be in contact with the first metal pattern 153. For example, when the first metal pattern 153 in the first string selection gate SSG1 may include tungsten, the first supplement conductive pattern 175a1' may include tungsten. However, embodiments are not limited thereto.

In the three dimensional semiconductor memory device according to an exemplary embodiment, a second supplement conductive pattern contacting one sidewall of the second string selection gate may have substantially the same shape as the first supplement conductive pattern 175a1' and/or may be formed of the same conductive material as the first supplement conductive pattern 175a1'. The second supplement conductive pattern may contact, be directly on, a sidewall of the second string selection gate, e.g., a barrier pattern may not be disposed therebetween.

The recessed regions 170 disposed at sides of the string selection gates SSG1 and SSG2 may have rounded sidewalls, e.g., concave sidewalls of the string selection gates. However, embodiments are not limited thereto. For example, the recessed region may have another shape.

Figure 3A:
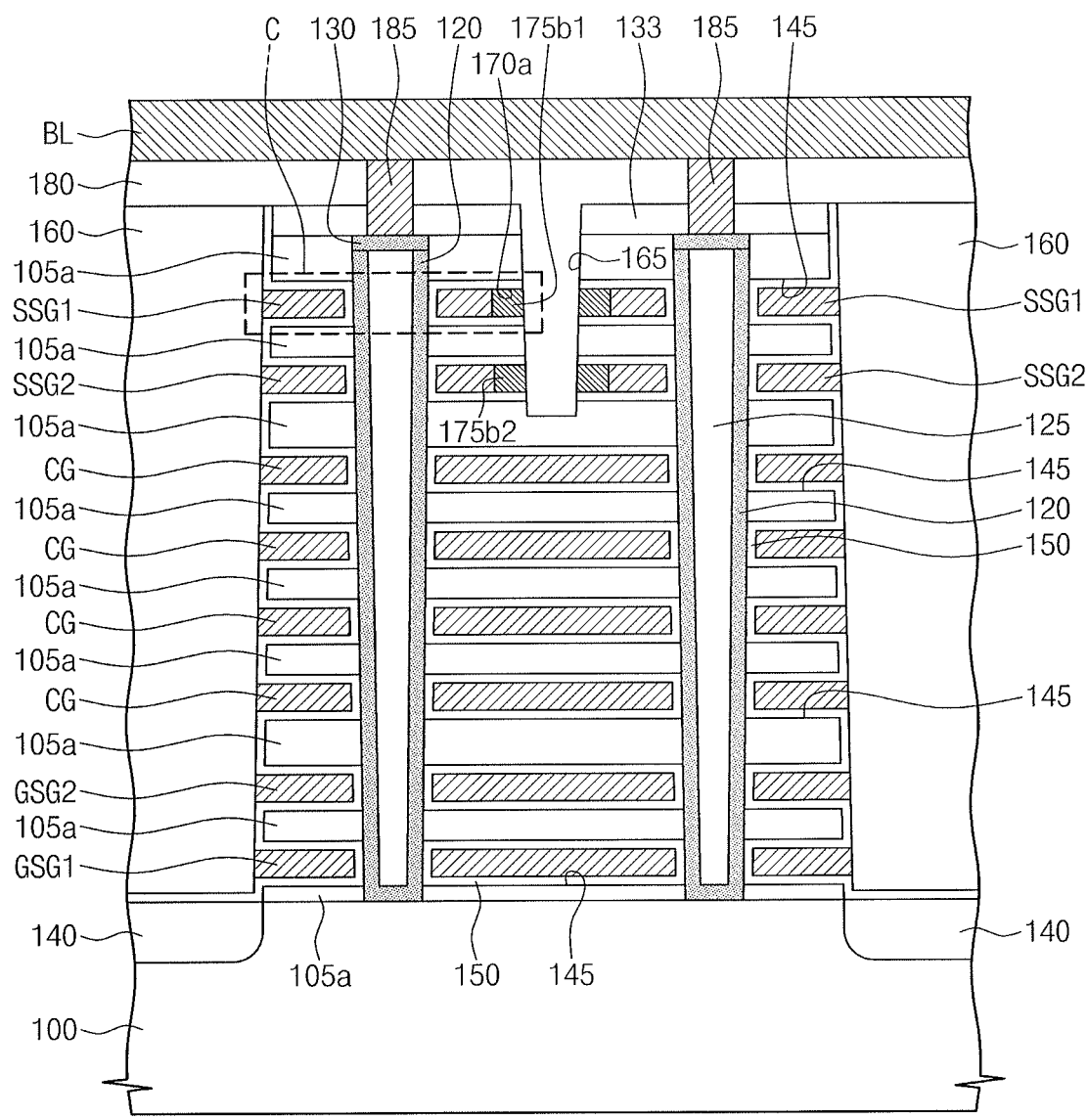
FIG. 3A illustrates a cross sectional view taken along a line I-I' of FIG. 1, according to an exemplary embodiment.
Figure 3B:
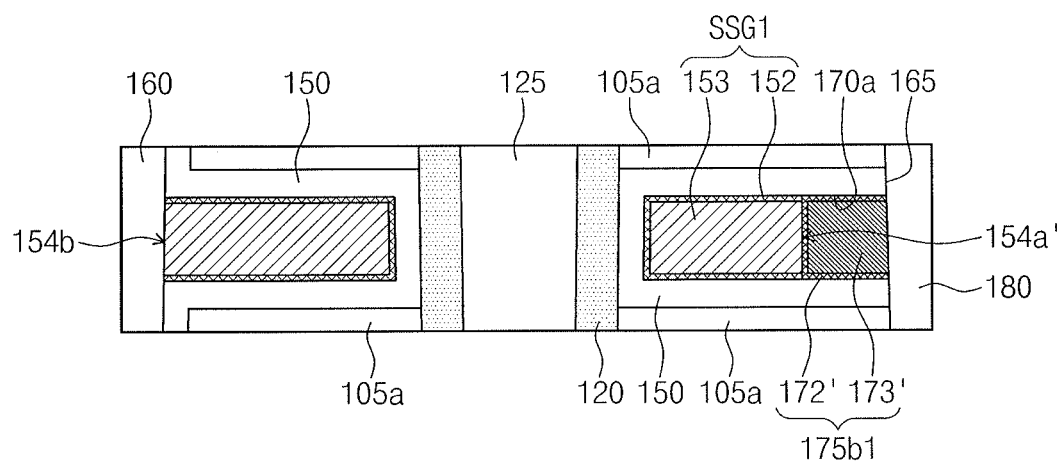
FIG. 3B illustrates an enlarged view of a portion 'C' of FIG. 3A, according to an exemplary embodiment.

FIG. 3A illustrates a cross sectional view taken along a line I-I' of FIG. 1, according to still another exemplary embodiment. FIG. 3B illustrates an enlarged view of a portion 'C' of FIG. 3A, according to still another exemplary embodiment.

Referring to FIGS. 3A and 3B, a first string selection gate SSG1 according to the present embodiment may include a first sidewall 154a' adjacent to the cutting trench 165 and a second sidewall 154b opposite to the first sidewall 154a', as illustrated in FIG. 3B. The first sidewall 154a' may have, e.g., a flat shape. In an exemplary embodiment, the first sidewall 154a' may be substantially perpendicular to the top surface of the substrate 100. The first sidewall 154a' may be laterally recessed, e.g., in the second direction, with respect to a sidewall of the insulating pattern 105a included in a sidewall of the cutting trench 165. Thus, a recessed region 170a may be defined beside the first sidewall 154a'. The recessed region 170a may be a space surrounded by the first sidewall 154a' and the insulating patterns 105a directly on and directly under the first string selection gate SSG1.

A first supplement conductive pattern 175b1 may fill the recessed region 170a beside the first sidewall 154a' of the first string selection gate SSG1. The first supplement conductive pattern 175b1 may be in contact with, e.g., directly on, the insulating patterns 105a and the first sidewall 154a', which may constitute an inner surface of the recessed region 170a. In an exemplary embodiment, a top surface of the first supplement conductive pattern 175b1 may be disposed at substantially the same level as, a same plane as, and/or coplanar with the top surface of the first string selection gate SSG1. A bottom surface of the first supplement conductive pattern 175b1 may be disposed at substantially the same level as, a same plane as, and/or a coplanar with the bottom surface of the first string selection gate SSG1. Both the top and bottom surfaces of the first supplement conductive pattern 175b1 may be disposed at substantially the same level as, a same plane as, and/or a coplanar with the top and bottom surfaces, respectively, of the first string selection gate SSG1.

In an exemplary embodiment, the first supplement conductive pattern 175b1 may include a barrier pattern 172' and a metal pattern 173', e.g., as illustrated in FIG. 3B. The barrier pattern 172' of the first supplement conductive pattern 175b1 may be disposed between the inner surface of the recessed region 170a and the metal pattern 173' of the first supplement conductive pattern 175b1. The barrier pattern 172' and the metal pattern 173' of the first supplement conductive pattern 175b1 may be formed of the same materials as the barrier pattern 172 and the metal pattern 173 of the first supplement conductive pattern 175a1 illustrated in FIG. 2C, respectively.

As illustrated in FIG. 3A, a recessed region beside the second string selection gate SSG2 may have substantially the same shape as the recessed region 170a beside the first string selection gate SSG1. A second supplement conductive pattern 175b2 contacting a sidewall of the second string selection gate SSG2 may have substantially the same shape as the first supplement conductive pattern 175b1 and/or may be formed of the same materials as the first supplement conductive pattern 175b1.

The barrier pattern 172' in the first supplement conductive pattern 175b1 may be omitted. This will be described with reference to FIG. 3C. In particular, FIG. 3C illustrates an enlarged view of a portion 'C' of FIG. 3A, according to yet another exemplary embodiment.

Figure 3C:
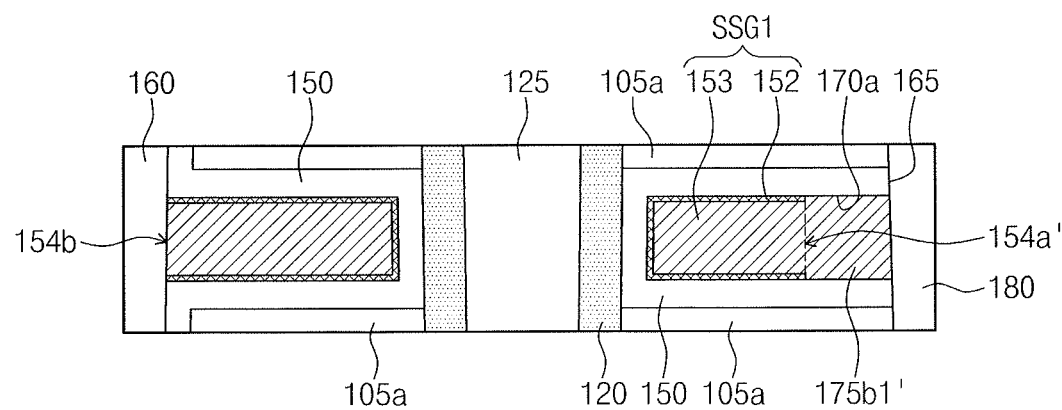
FIG. 3C illustrates an enlarged view of a portion 'C' of FIG. 3A, according to another exemplary embodiment.

Referring to FIG. 3C, a first supplement conductive pattern 175b1' contacting the first sidewall 154a' of the first string selection gate SSG1 may include a metal. The metal in the first supplement conductive pattern 175b1' may be the same as that in the first string selection gate SSG1. The metal in the first supplement conductive pattern 175b1' may be in contact with the metal pattern 153 in the first string selection gate SSG1. For example, the metal pattern 153 in the first string selection gate SSG1 may include tungsten and the metal in the first supplement conductive pattern 175b1' may be tungsten. However, embodiments are not limited thereto.

In the three dimensional semiconductor memory device according to an exemplary embodiment, a second supplement conductive pattern contacting a sidewall of the second string selection gate may have substantially the same shape as the first supplement conductive pattern 175b1' and/or may be formed of the same conductive material as the first supplement conductive pattern 175b1'.

Figure 4:
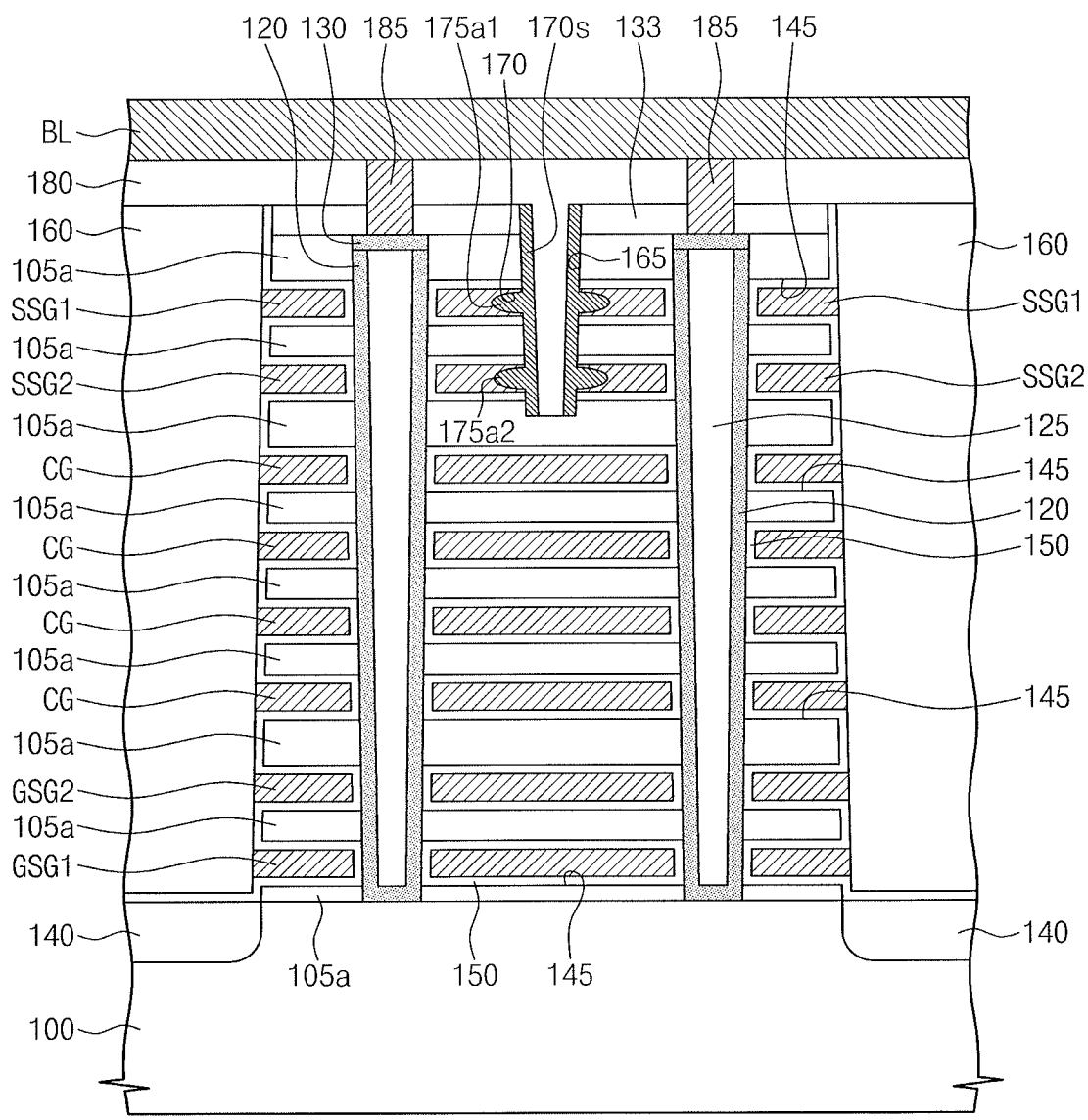
FIGS. 4 and 5 illustrate cross sectional views taken along a line I-I' of FIG. 1, according to exemplary embodiments.

FIG. 4 illustrates a cross sectional view taken along a line I-I' of FIG. 1, according to yet still another exemplary embodiment.

Referring to FIG. 4, according to the present embodiment, first and second supplement conductive patterns 175a1 and 175a2 contacting sidewalls of the first and second string selection gates SSG1 and SSG2 may extend to be connected to each other. The second and first string selection gates SSG2 and SSG1 may be sequentially stacked so that the second and first supplement conductive patterns 175a2 and 175a1 may be sequentially stacked in an overlapping relationship.

An extension portion 175s of the second and first supplement conductive patterns 175a2 and 175a1 may be a spacer-shape portion disposed on one inner sidewall of the cutting trench 165. The extension 175s disposed on the one inner sidewall of the cutting trench 165 may be separated from the extension 175s disposed on another inner sidewall, e.g., the opposing inner sidewall, of the cutting trench 165. The extension 175s disposed on the one inner sidewall of the cutting trench 165 may be insulated from the extension 175s disposed on the other inner sidewall of the cutting trench 165, e.g., the extensions 175s may be spaced apart on a bottom surface of the cutting trench 165. The extension 175s may extend along substantially an entire inner sidewall of the cutting trench 165.

When a vertical cell string is operated, the second and first string selection gates SSG2 and SSG1 in the vertical cell string may be operated by substantially the same manner. Thus, even though the second and first supplement conductive pattern 175a2 and 175a1 contacting the second and first string selection gates SSG2 and SSG1 may be connected to each other, the vertical cell string may be operated.

In FIG. 4, the first and second supplement conductive patterns 175a1 and 175a2 may be replaced with the first and second supplement conductive patterns 175b1 and 175b2 illustrated in FIGS. 3A and 3B. In other words, the second and first supplement conductive patterns 175b2 and 175b1 of FIGS. 3A and 3B that are sequentially stacked may be connected to each other.

Figure 5:
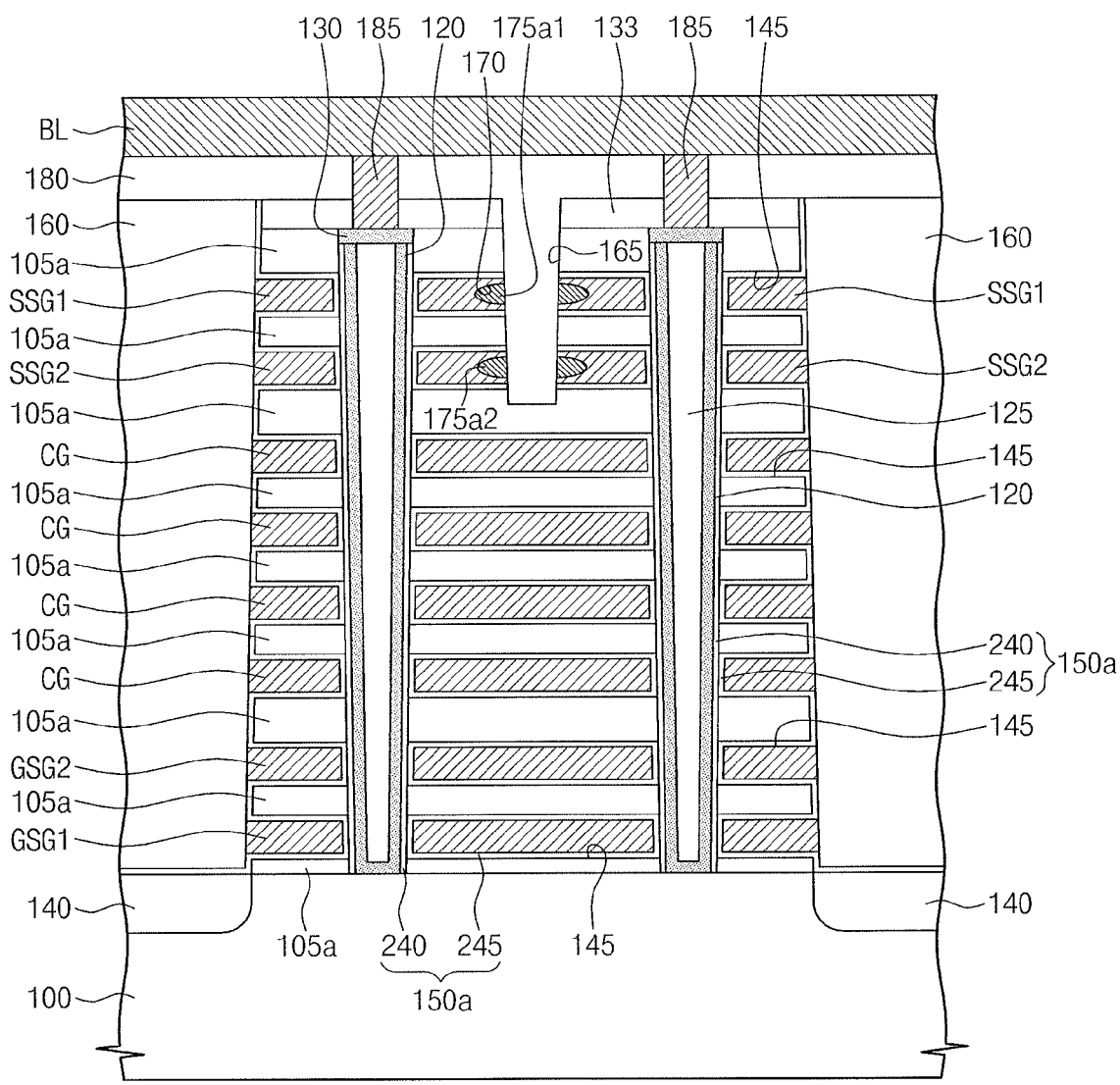

FIG. 5 illustrates a cross sectional view taken along a line I-I' of FIG. 1, according to a further exemplary embodiment.

Referring to FIG. 5, a multi-layered dielectric layer 150a disposed between the sidewall of the vertical active pattern 120 and each of the gate patterns GSG1, GSG2, CG, SSG2, and SSG1 may include a first sub-layer 240 and a second sub-layer 245. The multi-layered dielectric layer 150a may include a tunnel dielectric layer, a charge storage layer, and a blocking dielectric layer. The tunnel dielectric layer, the charge storage layer, and the blocking dielectric layer of the multi-layered dielectric layer 150a may be formed of the same materials as the tunnel dielectric layer 147, the charge storage layer 148, and the blocking dielectric layer 149 described with reference to FIG. 2B, respectively.

The first sub-layer 240 of the multi-layered dielectric layer 150a may substantially vertically extend to be disposed between the sidewall of the vertical active pattern 120 and the insulating patterns 105a. The second sub-layer 245 may substantially horizontally extend to cover top and bottom surfaces of each of the gate patterns GSG1, GSG2, CG, SSG2, and SSG1. The first sub-layer 240 may include at least a portion of the tunnel dielectric layer and the second sub-layer 245 may include at least a portion of the blocking dielectric layer. One of the first and second sub-layers 240 and 245 may include the charge storage layer. In an embodiment, the first sub-layer 240 may include the tunnel dielectric layer, the charge storage layer, and a barrier dielectric layer included in the blocking dielectric layer. However, embodiments are not limited thereto. For example, the first and second sub-layers 240 and 245 may be embodied in different forms.

In the three dimensional semiconductor memory device illustrated in FIG. 5, the first and second supplement conductive patterns 175a1 and 175a2 may be replaced with the first and second supplement conductive patterns described with reference to FIGS. 2D, 3A, 3B, 3C, and 4.

Next, methods of fabricating three dimensional semiconductor memory devices according to exemplary embodiments will be described with reference to the figures.

FIGS. 6A through 6H illustrate cross sectional views depicting an exemplary method of fabricating a three dimensional semiconductor memory device.

Figure 6A:
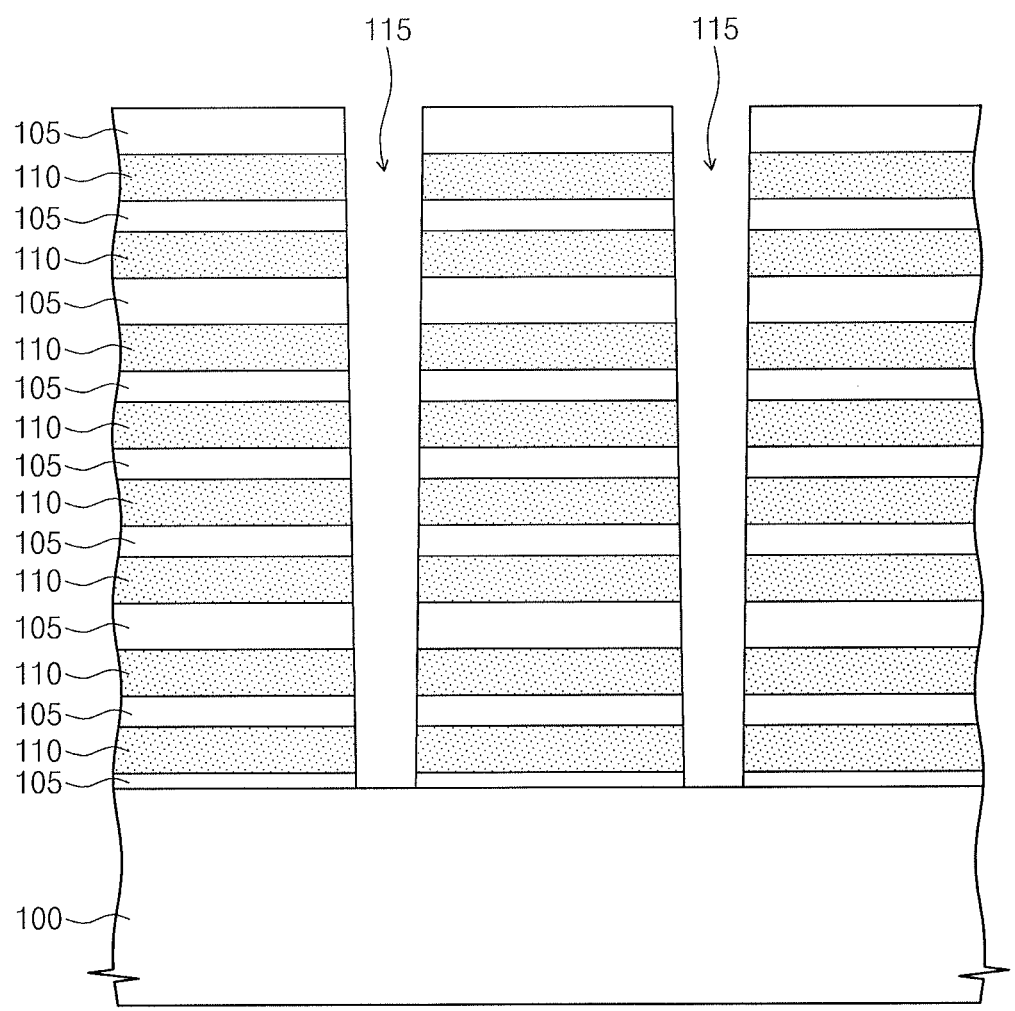
FIGS. 6A through 6H illustrate cross sectional views depicting a method of fabricating a three dimensional semiconductor memory device, according to an exemplary embodiment.

Referring to FIG. 6A, a plurality of insulating layers 105 and a plurality of sacrificial layers 110 may be alternately and repeatedly stacked on a substrate 100. The substrate 100 may include a well region doped with dopants of a first conductivity type. The sacrificial layers 110 may include a material having an etch selectivity with respect to the insulating layers 105. For example, the insulating layers 105 may be formed of oxide layers and the sacrificial layers 110 may be formed of nitride layers.

The insulating layers 105 and the sacrificial layers 110 may be successively patterned to form openings 115 that expose the substrate 100. In an exemplary embodiment, the openings 115 may be vertical holes.

Figure 6B:
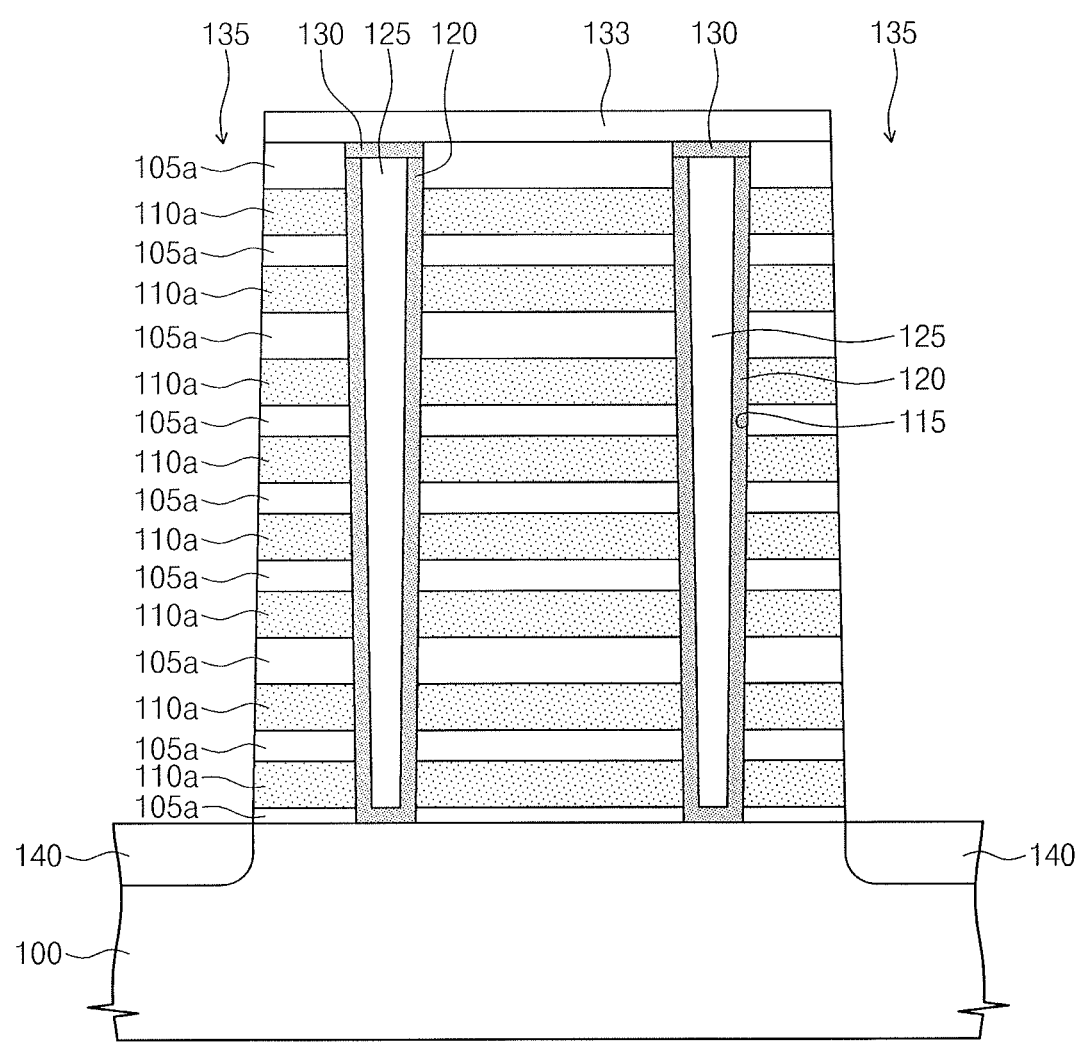

Referring to FIG. 6B, an active layer may be conformally formed on the substrate 100 having the openings 115. The active layer may be formed on inner surfaces of the openings 115 with, e.g., substantially uniform thickness. The active layer may be formed of a semiconductor material. The active layer may be doped with dopants of the first conductivity type or may be undoped. A filling insulating layer 125 may be formed on the active layer to fill, e.g., completely fill, the openings 115. The filling insulating layer 125 and the active layer may be planarized until an uppermost insulating layer 105 of the insulating layers 105 is exposed. Thus, the vertical active pattern 120 and the filling insulating pattern 125 may be formed, e.g., may be formed only, in each of the openings 115. Top surfaces of the vertical active pattern 125 and the filling insulating pattern 125 may be recessed to be lower than a top surface of the uppermost insulating layer 105.

A capping semiconductor layer may be formed on the substrate 100 and the capping semiconductor layer may be planarized until the uppermost insulating layer 105 is exposed. Thus, a capping semiconductor pattern 130 may be formed in each of the openings 115. The capping semiconductor pattern 130 may fill a portion of the opening 115 on the vertical active pattern 120 and the filling insulating pattern 125. In an exemplary embodiment, dopants of a second conductivity type may be provided in the capping semiconductor pattern 130 and an upper portion of the vertical active pattern 120 to form a drain.

A first interlayer dielectric layer 133 may be formed on the substrate 100 including the capping semiconductor pattern 130, e.g., the first interlayer dielectric layer 133 may be formed on the capping semiconductor pattern 130 and on the uppermost insulating pattern 105a. The first interlayer dielectric layer 133, the insulating layers 105, and the sacrificial layers 110 may be successively patterned to form device isolation trenches 135. The insulating patterns 105a and the sacrificial patterns 110a that are alternately and repeatedly stacked may be arranged between the device isolation trenches 135. A portion of the first interlayer dielectric layer 133 may remain on the uppermost insulating pattern 105a of the insulating patterns 105a. The insulating patterns 105a and the sacrificial patterns 110a that are alternately and repeatedly stacked may include the openings 115 and the vertical active patterns 120 extending therethrough.

Dopants of the second conductivity type may be provided into the substrate 100 under the device isolation trench 135 to, e.g., form a common source region 140.

Figure 6C:
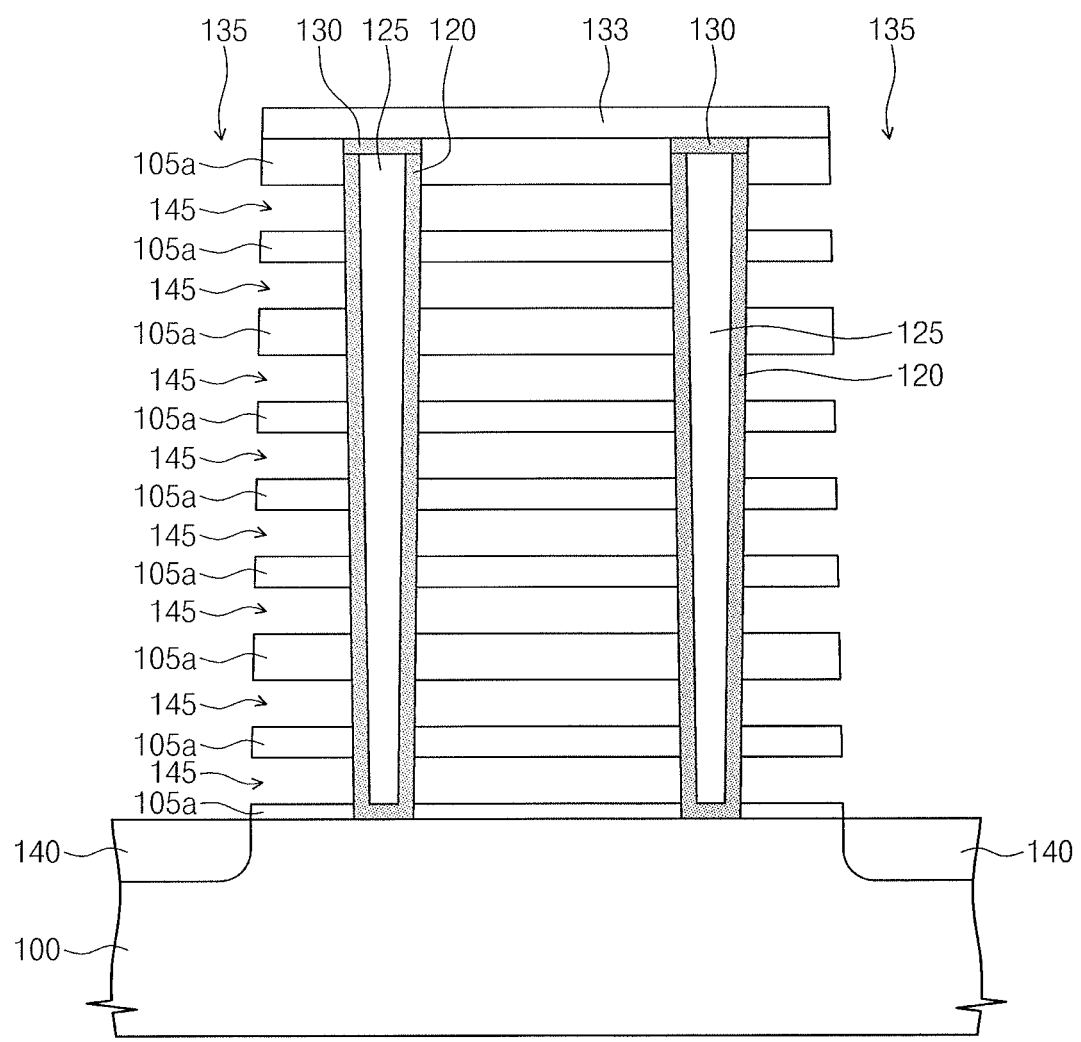
Figure 6D:
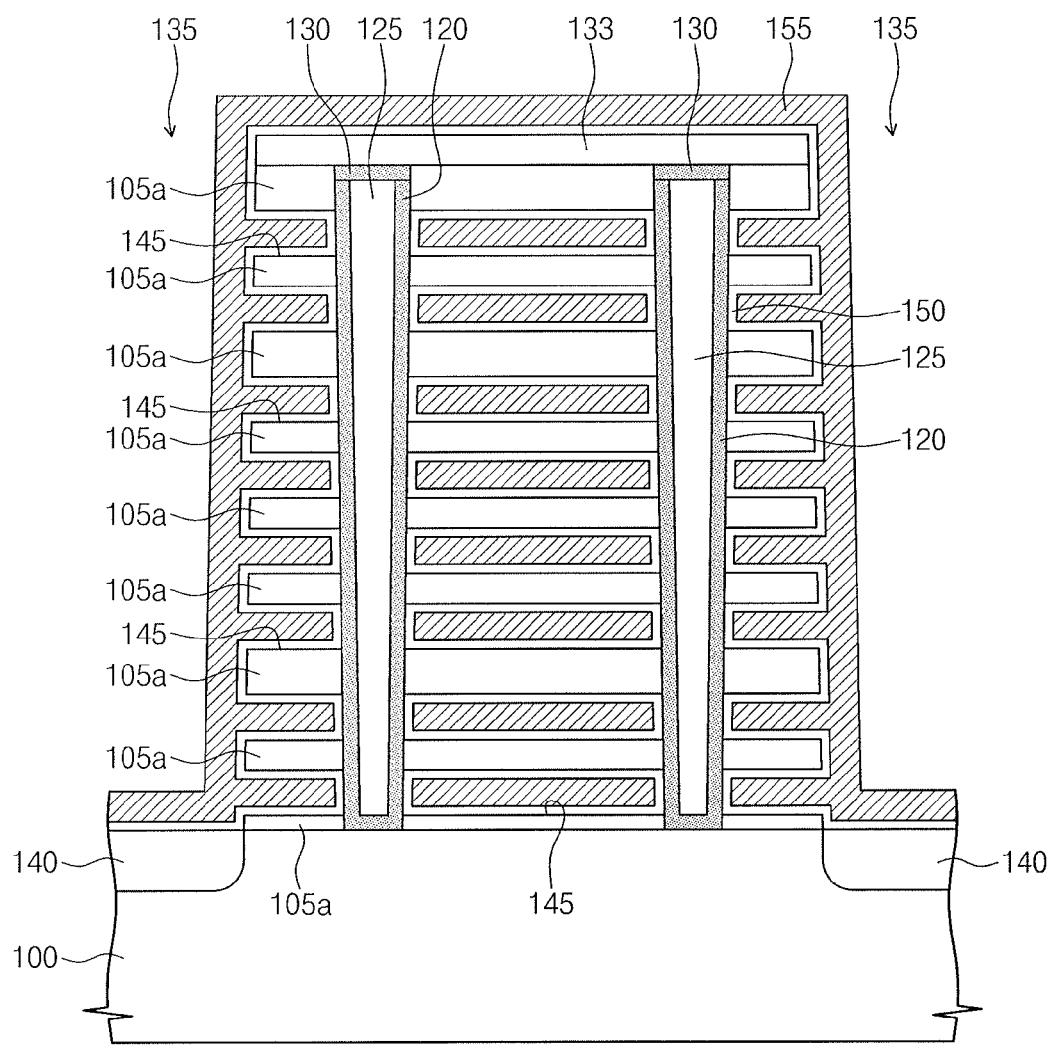

Referring to FIG. 6C, the sacrificial patterns 110a exposed by the device isolation trenches 135 may be removed to form empty regions 145. The empty regions 145 may expose portions of the sidewall of the vertical active pattern 120.

Referring to 6D, a multi-layered dielectric layer 150 may be formed on the substrate 100 having the empty regions 145. The multi-layered dielectric layer 150 may be formed, e.g., conformally formed, on inner surfaces of the empty regions 145.

A gate conductive layer 155 may be formed on the substrate 100 having the multi-layered dielectric layer 150 to fill, e.g., completely fill, the empty regions 145. The gate conductive layer 155 may be formed, e.g., conformally formed, on inner surfaces of the device isolation trenches 135. For example, the gate conductive layer 155 may partially fill each of the device isolation trenches 135.

In an exemplary embodiment, the gate conductive layer 155 may include a first barrier conductive layer and a first metal layer. The first barrier conductive layer may be formed, e.g., conformally formed, on the substrate 110 having the empty regions 145 and the multi-layered dielectric layer 150. The first metal layer may be formed on the first barrier conductive layer to fill, e.g., completely fill, the empty regions 145. The first barrier conductive layer and the first metal layer may be formed of the same materials as the first barrier pattern 152 and the first metal pattern 153 described with reference to FIG. 2C, respectively. However, embodiments are not limited thereto. For example, the gate conductive layer 155 may include a semiconductor material doped with dopants.

Figure 6E:
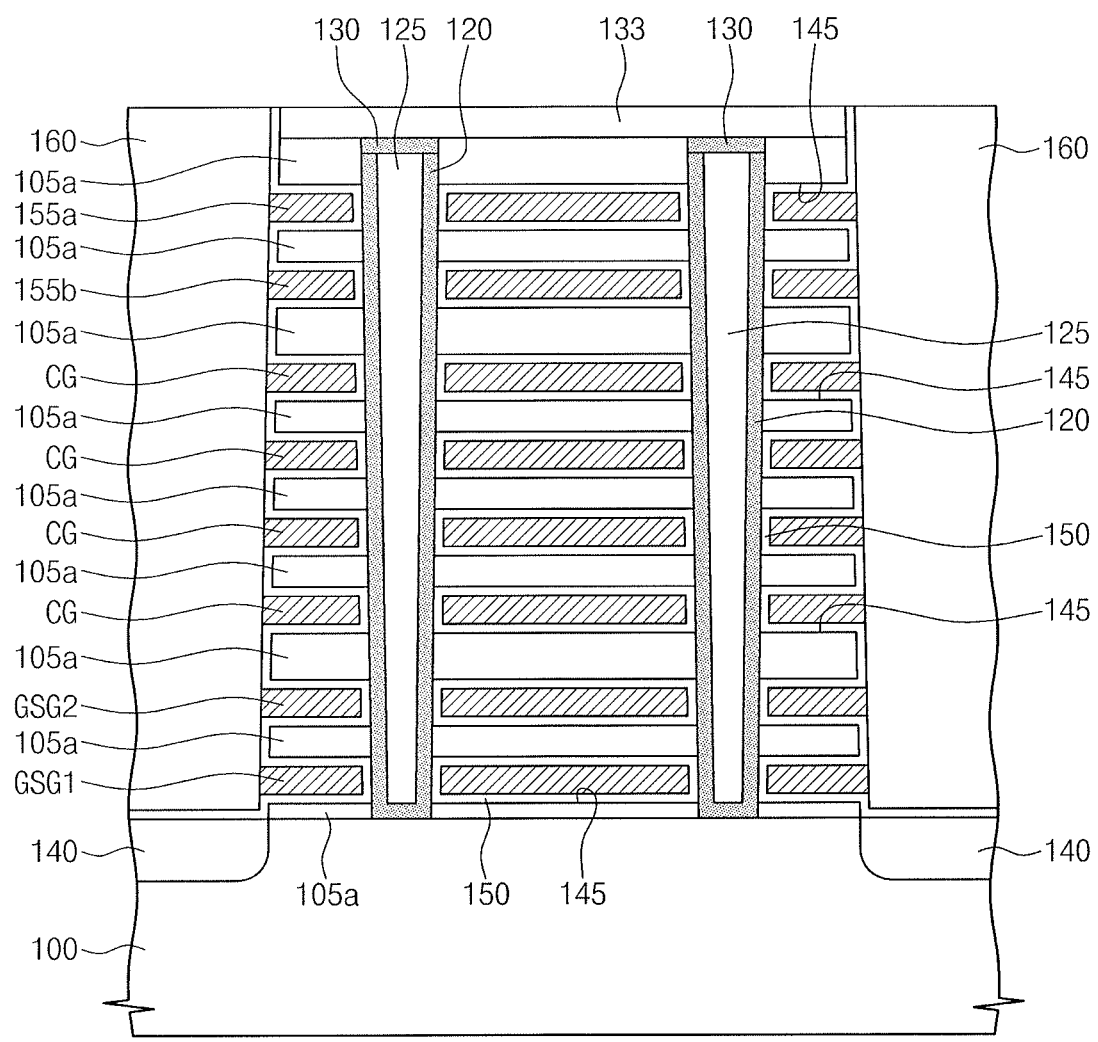

Referring to FIG. 6E, the gate conductive layer 155 may be isotropically etched to form gate patterns GSG1, GSG2, CG, 155b, and 155a filling the empty regions 145. The gate patterns GSG1, GSG2, CG, 155b, and 155a may be separated from each other. The gate patterns GSG1, GSG2, CG, 155b, and 155a may include a plurality of stacked cell gates CG, and at least one floor of a ground selection gate, e.g., ground selection gates GSG1 and GSG2, between a lowermost cell gate CG of the cell gates CG and the substrate 100. In an embodiment, the gate patterns GSG1, GSG2, CG, 155b, and 155a may include both the first and second ground selection gates GSG1 and GSG2 stacked between the lowermost cell gate CG and the substrate 100. The gate patterns GSG1, GSG2, CG, 155b, and 155a may include a first preliminary string selection gate 155a disposed over, e.g., above, an uppermost cell gate CG of the cell gates CG. The gate patterns GSG1, GSG2, CG, 155b, and 155a may include a second preliminary string selection gate 155b disposed between the first preliminary string selection gate 155a and the uppermost cell gate CG.

Subsequently, a device isolation layer may be formed to fill the device isolation trenches 135 and then the device isolation layer may be planarized to form device isolation patterns 160. When the device isolation layer is planarized, the multi-layered dielectric layer on a top surface of the first interlayer dielectric layer 133 may be removed.

Figure 6F:
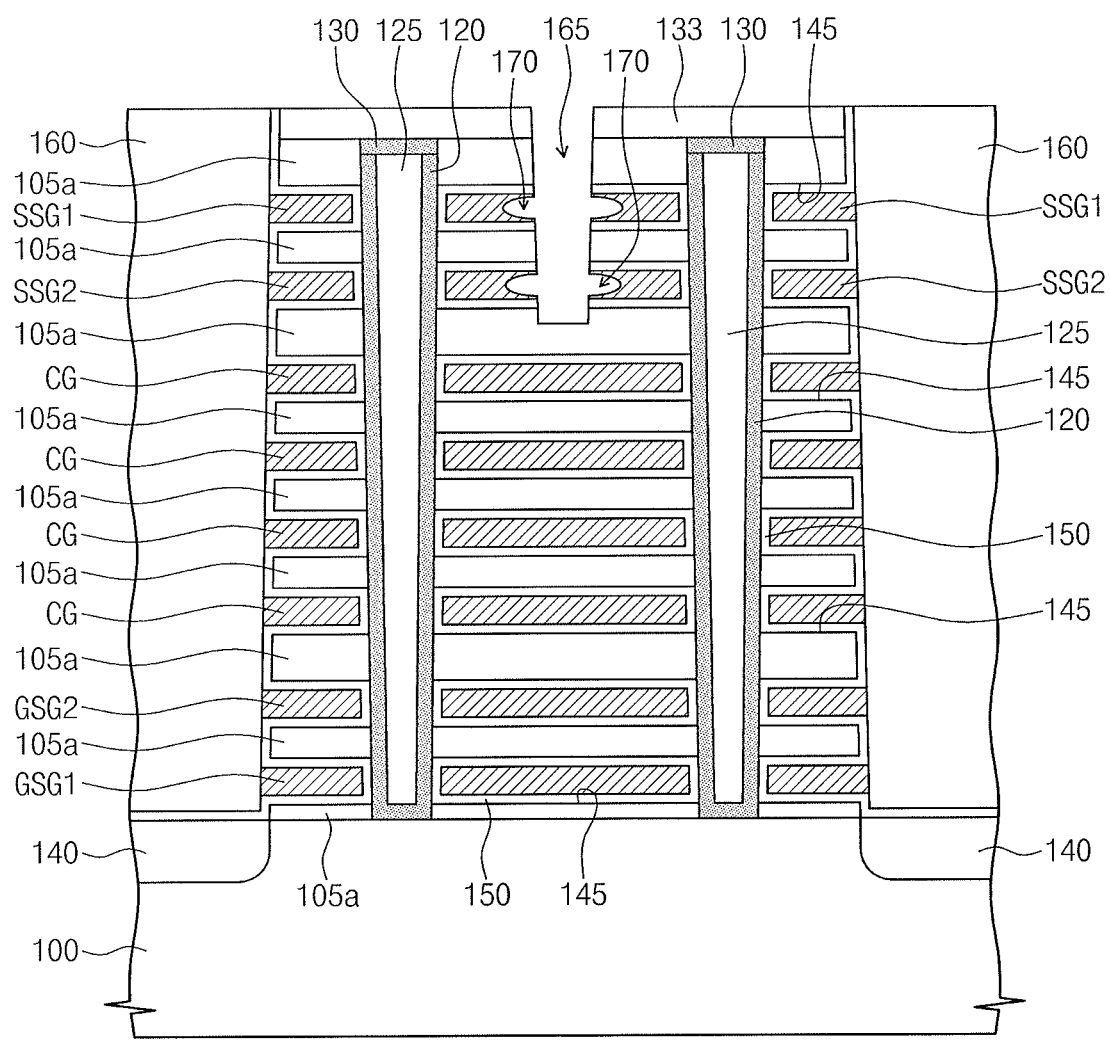

Referring to FIG. 6F, the first interlayer dielectric layer 133, the preliminary string selection gates 155a and 155b, and the insulating patterns 105a on the preliminary string selection gates 155a and 155b may be successively patterned to form a cutting trench 165. The first preliminary string selection gate 155a may be formed into a plurality of first string selection gates SSG1 being laterally separated from each other by the cutting trench 165. The second preliminary string selection gate 155b may be formed into a plurality of second string selection gates SSG2 being laterally separated from each other by the cutting trench 165.

Sidewalls of the first and second string selection gates SSG1 and SSG2, which may be exposed by both inner sidewalls of the cutting trench 165, may be laterally recessed. Thus, recessed regions 170 may be formed. Sidewalls of the first and second string selection gate SSG1 and SSG2 exposed by the recessed regions 170 may be laterally concave. That is, the sidewalls of the first and second string selection gates SSG1 and SSG2 may have rounded shapes.

The patterning process for forming of the cutting trench 165 may include at least one of a photolithography process defining the cutting trench 165, an etching process, and a cleaning process. The recessed regions 170 may be formed by the etching process and/or the cleaning process of the patterning process. In an exemplary embodiment, even though the etching process may be an anisotropic etching process, at least portions of the sidewalls of the string selection gates SSG1 and SSG2 exposed by the cutting trench 165 may be etched. Alternatively, another process stage may be performed, e.g., an additional etching process, to form the recessed regions 170.

Figure 6G:
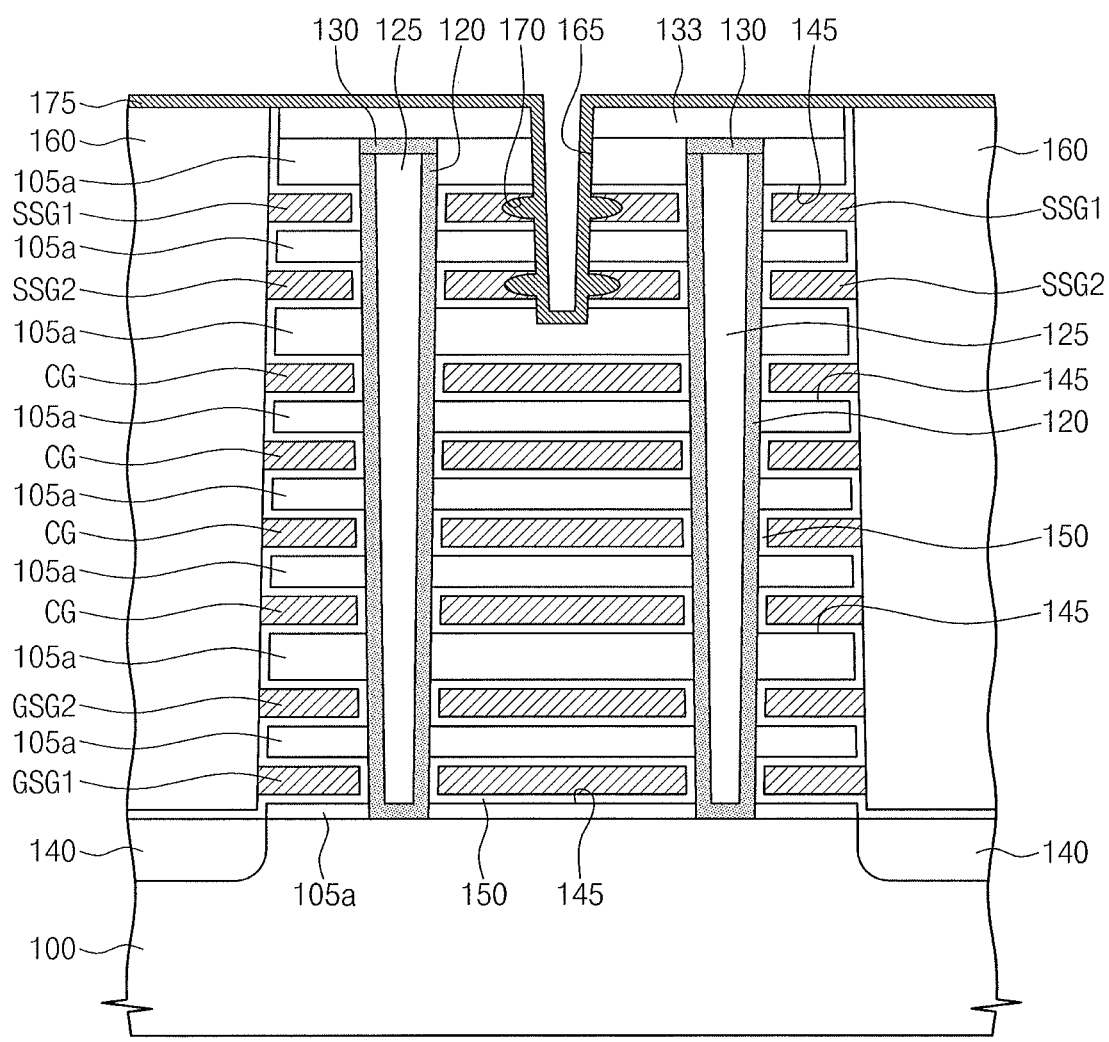

Referring to FIG. 6G, a supplement conductive layer 175 may be formed on the substrate 100 to fill the recessed regions 170. In an embodiment, the supplement conductive layer 175 may be formed by an atomic layer deposition (ALD) process and/or a chemical vapor deposition (CVD) process. The supplement conductive layer 175 may include a second barrier conductive layer and a second metal layer. The second barrier conductive layer may be formed, e.g., conformally formed, on the substrate 100 having the recessed regions 170. The second metal layer may be formed on the second barrier conductive layer to fill, e.g., completely fill, the recessed regions 170. As described above, the second barrier conductive layer and the second metal layer may be formed by the ALD process and/or the CVD process. According to an exemplary embodiment, the second barrier conductive layer and the second metal layer may be formed of the same materials as the second barrier pattern 172 and the second metal pattern 173 illustrated in FIG. 2C, respectively.

Figure 6H:
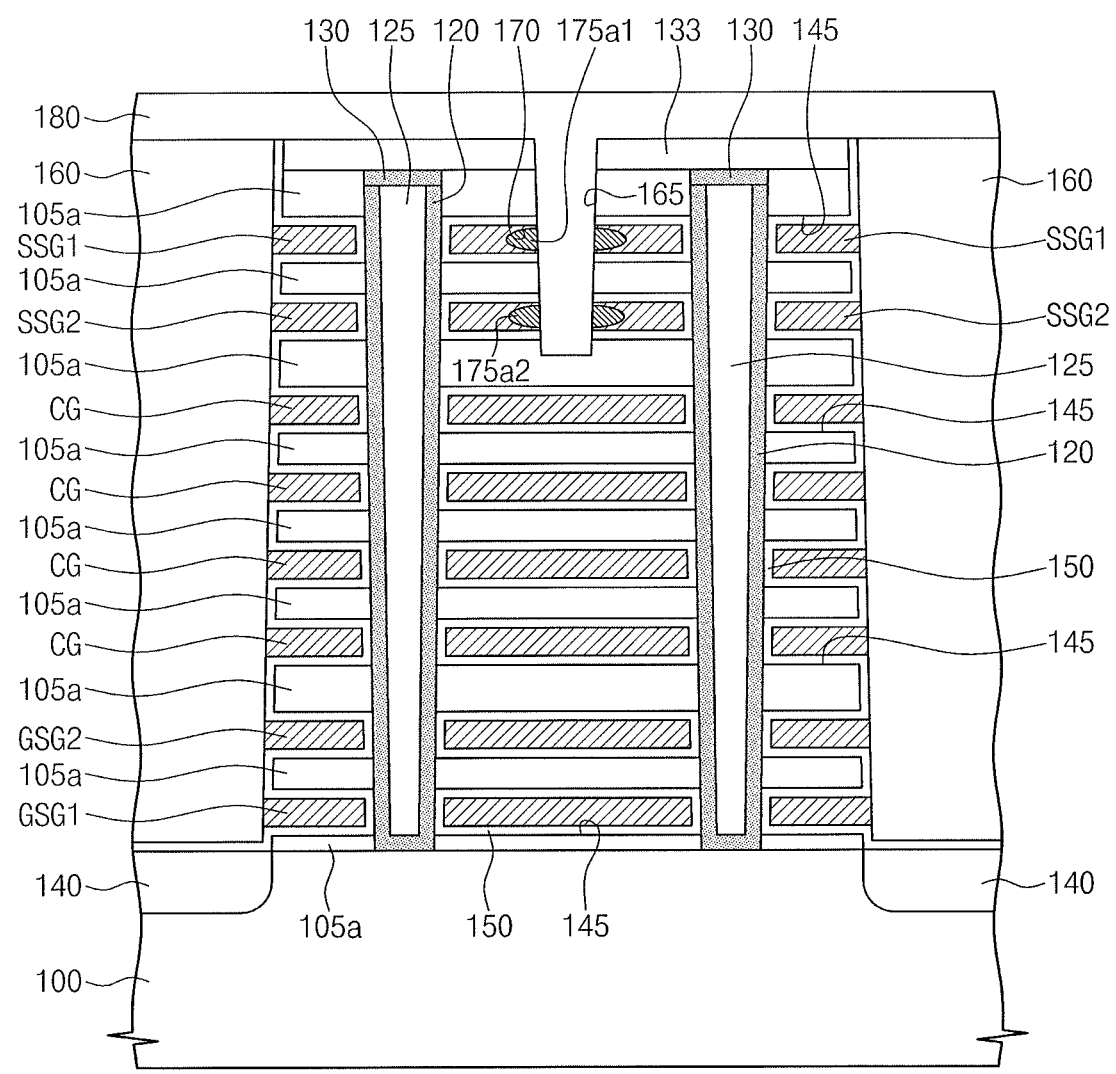

Referring to FIG. 6H, the supplement conductive layer 175 outside the recessed regions 170 may be removed to form first and second supplement conductive patterns 175a1 and 175a2 filling the recessed regions 170. The first supplement conductive pattern 175a1 may fill the recessed region 170 beside the first string selection gate SSG1, and the second supplement conductive pattern 175a2 may fill the recessed region 170 beside the second string selection gate SSG2. The first and second supplement conductive patterns 175a1 and 175a2 may be in contact with the sidewalls of the first and second string selection gates SSG1 and SSG2, respectively.

A second interlayer dielectric layer 180 may be formed on the substrate 100 to fill the cutting trench 165. Subsequently, contact plugs 185 and bit lines BL illustrated in FIGS. 1 and 2A may be formed.

According to the method of fabricating the three dimensional semiconductor memory device mentioned above, the sidewall of the first and second string selection gates SSG1 and SSG2 may be recessed during, e.g., by, the patterning process for formation of the cutting trench 165. Since the recessed regions 170 may be filled with the first and second supplement conductive patterns 175a1 and 175a2, the resistances of the first and second string selection gates SSG1 and SSG2 may be minimized.

According to another exemplary embodiment, the supplement conductive patterns may be formed by another method. This will be described with reference to FIG. 7.

FIG. 7 illustrates a flow chart of an exemplary method of forming a supplement conductive pattern of a three dimensional semiconductor memory device, according to another exemplary embodiment.

Referring to FIGS. 6E, 6F, and 7, the first interlayer dielectric layer 133, the insulating patterns 105a, and the preliminary string selection gates 155a and 155b may be successively patterned to form the cutting trench 165 (S200). As described above, the first and second string selection gates SSG1 and SSG2 may be formed during the process of forming the cutting trench 165. For example, the first and second string selection gates SSG1 and SSG2 exposed by the cutting trench 165 may be laterally recessed to form the recessed regions 170.

Referring to FIGS. 6F, 7 and 2D, a selective growth process may be performed using the first and second string selection gates SSG1 and SSG2 exposed by the recessed regions 170 as seed layers to form a first supplement conductive pattern 175a1' and a second supplement conductive pattern (S210). The supplement conductive patterns may be formed, e.g., conformally formed, in the recessed regions 170 by the selective growth process. The process of removing the supplement conductive layer outside the recessed regions 170 described with reference to FIG. 6H may not be required. The following processes may be performed using the same manners as described with reference to FIG. 6H.

Figure 8:
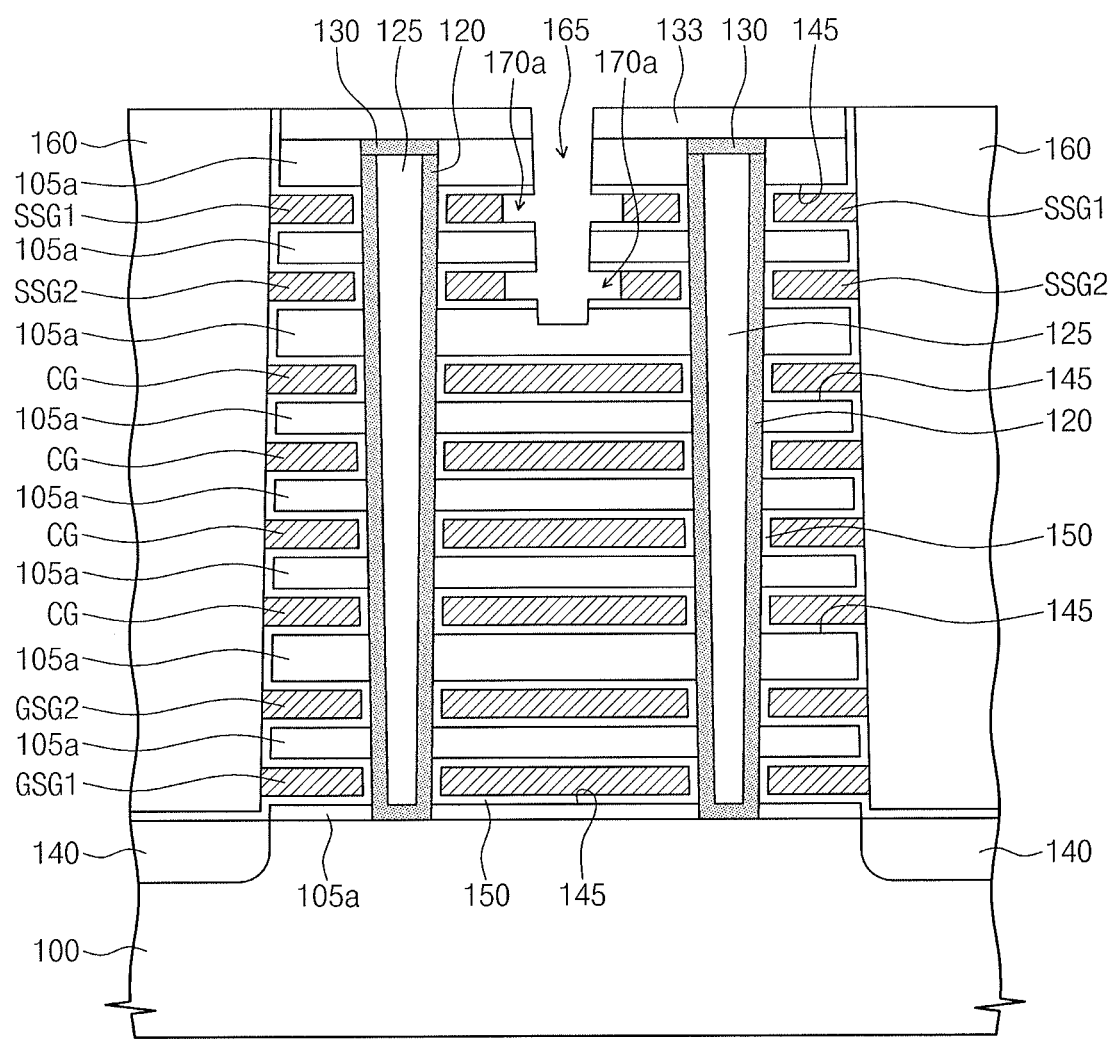
FIG. 8 illustrates a cross sectional view depicting a method of fabricating a three dimensional semiconductor memory device, according to an exemplary embodiment.

The recessed regions 170 may be realized to have another shape. FIG. 8 illustrates a cross sectional view depicting a method of fabricating a three dimensional semiconductor memory device, according to another exemplary embodiment.

Referring to FIG. 8, sidewalls of the first and second string selection gates SSG1 and SSG2 may be laterally recessed by the etching process and/or the cleaning process in the patterning process for formation of the cutting trench 165. The recessed sidewalls of the first and second string selection gates SSG1 and SSG2 may be substantially flat. For example, inner surfaces of each of recessed regions 170a may include edges of a bottom surface and/or a top surface of the insulating patterns 105a disposed directly on and directly under the string selection gates SSG1 and SSG2.

Subsequently, the formation method of the supplement conductive patterns and the following processes described with reference to FIGS. 6G and 6H may be performed. Thus, e.g., the three dimensional semiconductor memory device illustrated in FIGS. 3A and 3B may be realized.

Alternatively, the selective growth process described with reference to FIG. 7 may be performed to the substrate 100 having the recessed regions 170a. Thus, e.g., the three dimensional semiconductor memory device illustrated in FIG. 3C may be realized.

Next, a method of fabricating the three dimensional semiconductor memory device illustrated in FIG. 4 will be described with reference to figures. The method may include methods described with reference to FIGS. 6A through 6G.

Figure 9A:
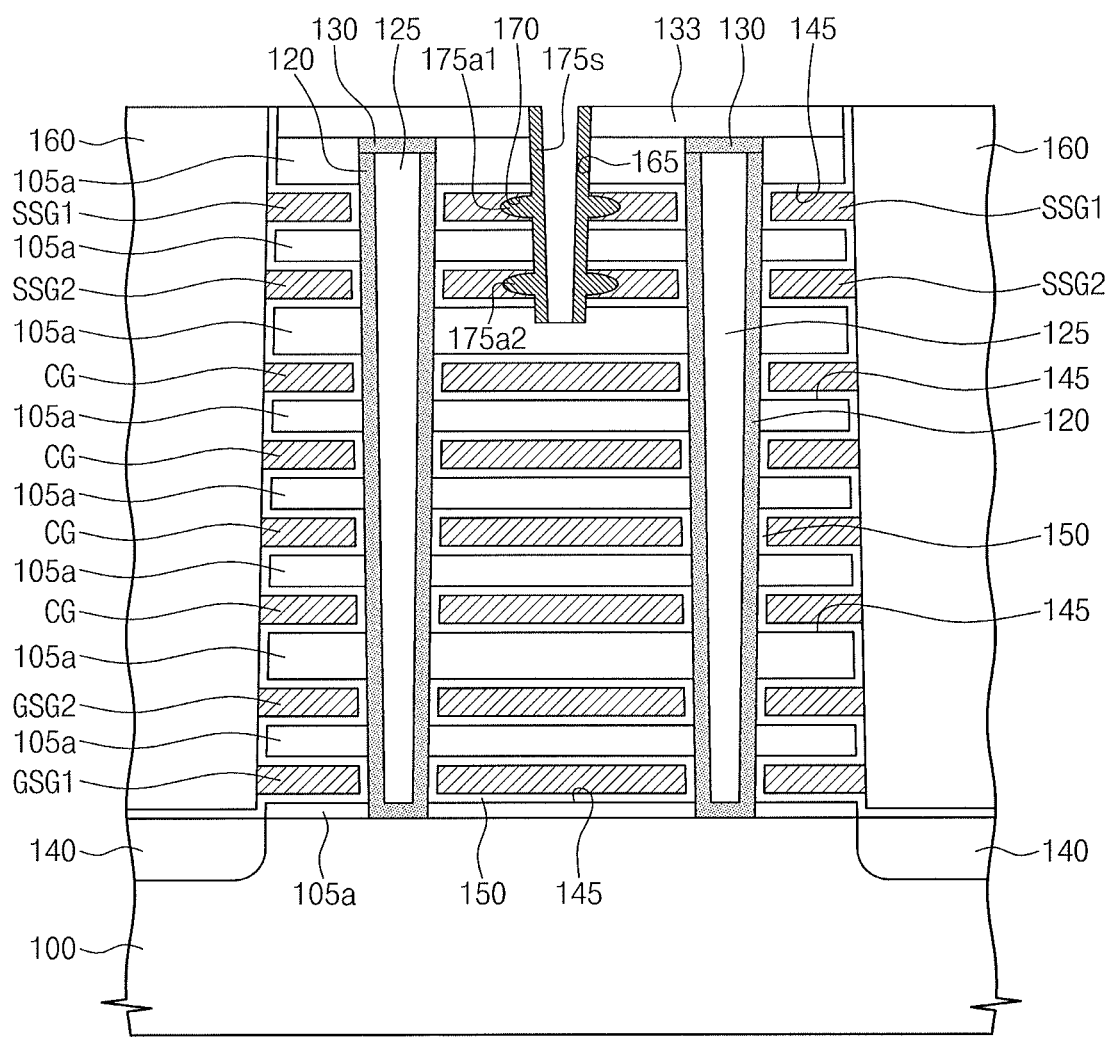
FIG. 9A illustrates a cross sectional view depicting a method of fabricating a three dimensional semiconductor memory device, according to an exemplary embodiment.
Figure 9B:
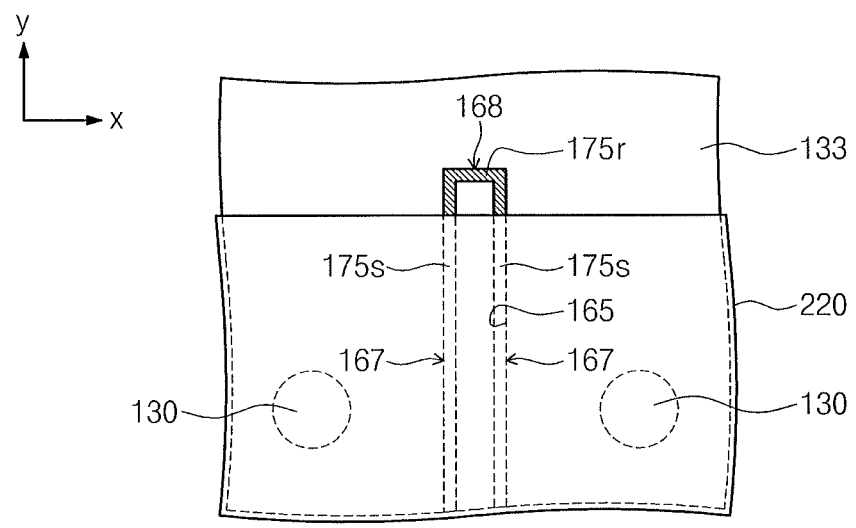
FIGS. 9B and 9C illustrate plan views depicting a method of fabricating a three dimensional semiconductor memory device, according another exemplary embodiment.
Figure 9C:
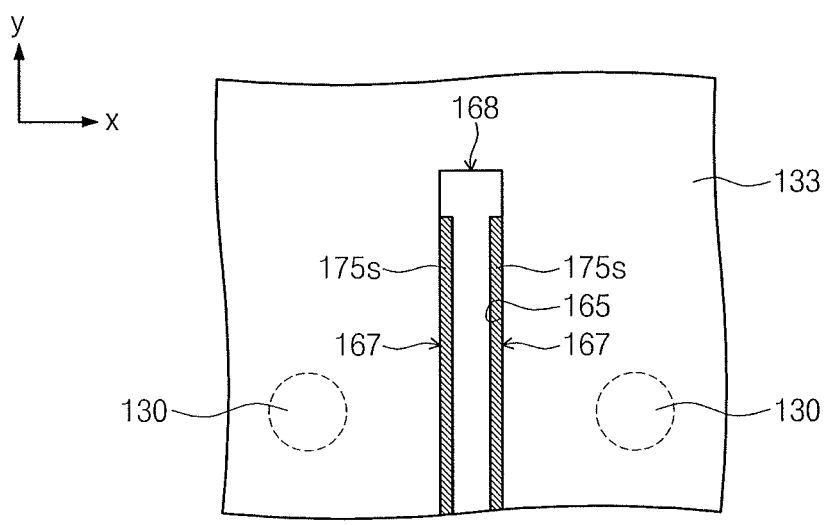

FIG. 9A illustrates a cross sectional view of a method of fabricating a three dimensional semiconductor memory device, according to still another exemplary embodiment. FIGS. 9B and 9C illustrate plan views depicting a method of fabricating a three dimensional semiconductor memory device, according to still another exemplary embodiment.

Referring to FIGS. 6G and 9A, the supplement conductive layer 175 may be anisotropically etched until a bottom surface of the cutting trench 165 is exposed, e.g., an insulating pattern 105a under the under the second string selection gate SSG2 is exposed. Thus, the first and second supplement conductive patterns 175a1 and 175a2 may be formed to fill the recessed regions 170. Extensions 175s of a spacer-shape may be formed on both inner sidewalls of the cutting trench 165. The supplement conductive patterns 175a1 and 175a2 and the extensions 175s may correspond to portions of the supplement conductive layer 175. The extension 175s on one inner sidewall of the cutting trench 165 may be in contact with the first and second supplement conductive patterns 175a1 and 175a2 in the recessed regions 170 of the one inner sidewall of the cutting trench 165. Thus, the second and first supplement conductive patterns 175a2 and 175a1 on the one inner sidewall of the cutting trench 165, which are sequentially stacked, may be connected to each other.

It is preferable that the extension 175s disposed on the one sidewall of the cutting trench 165 may be separated from the extension 175s disposed on another sidewall of the cutting trench 165.

A separation process of a pair of the extensions 175s on the both inner sidewalls of the cutting trench 165 may include the process anisotropically etching the supplement conductive layer 175. The separation process may further include a process that removes an extension on an edge sidewall of the cutting trench 165. This will be described with reference to FIGS. 9B and 9C.

Referring to FIG. 9B, the cutting trench 165 may include both inner sidewalls 167 extending in the first direction (e.g. y-axis direction). The cutting trench 165 may further include an edge sidewall 168 extending in the second direction (e.g. x-axis direction) perpendicular to the first direction. The cutting trench 165 may include a pair of the edge sidewalls 168 opposite to each other.

In an embodiment, the extensions 175s respectively formed on the both inner sidewalls 167 of the cutting trench 165 may be connected to each other through a residue 175r of the supplement conductive layer disposed on the edge sidewall 168. A mask pattern 220 may be formed on the substrate 100. The mask pattern 220 may cover the extensions 175s on the both inner sidewalls 167 of the cutting trench 165 while the residue 175r of the supplement conductive layer on the edge sidewall 168 may be exposed.

Referring to FIG. 9C, the residue 175r of the supplement conductive layer may be removed using the mask pattern 220 as an etch mask. Thus, the extensions 175s on the both inner sidewalls 167 of the cutting trench 165 may be separated from each other. The following processes may be performed using substantially the same manners as described with reference to FIG. 6H. Thus, the three dimensional semiconductor memory device illustrated in, e.g., FIG. 4, may be realized. In an embodiment, the recessed region 170 of FIG. 9A may be formed into the shape of the recessed region 170a of FIG. 8.

Next, a method of forming the multi-layered dielectric layer 150a illustrated in FIG. 5 will be described with reference to figures. The method may include methods described with reference to FIG. 6A.

Figure 10A:
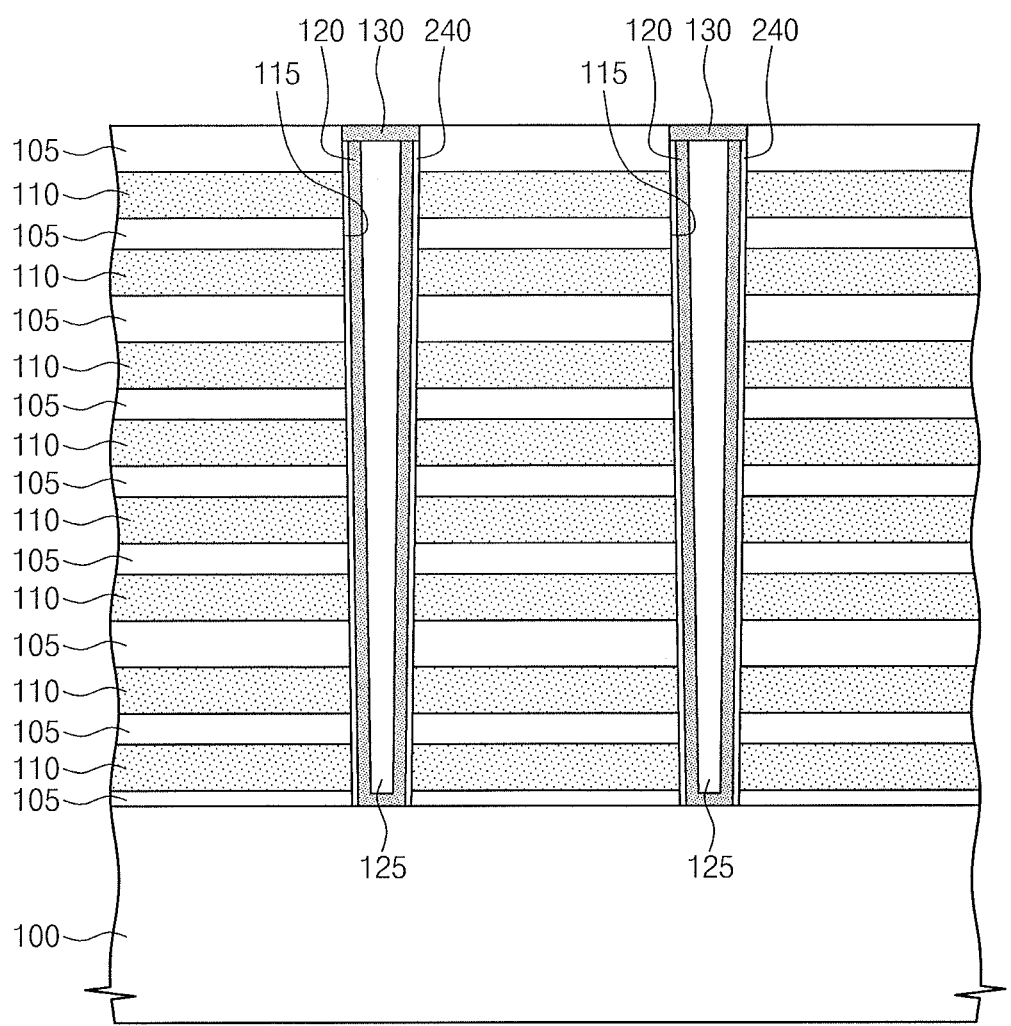
FIGS. 10A through 10C illustrate cross sectional views depicting a method of fabricating a three dimensional semiconductor memory device, according to an exemplary embodiment.
Figure 10B:
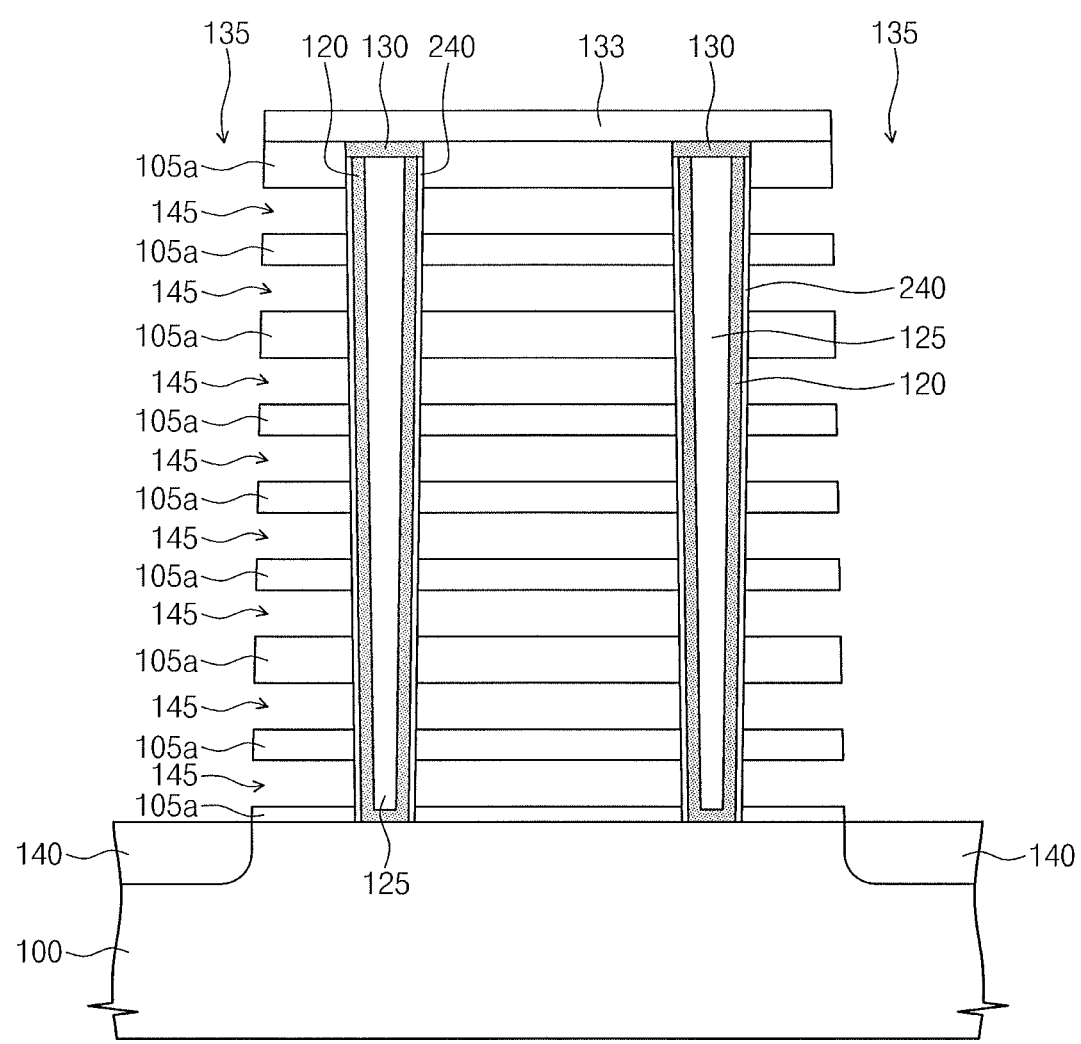
Figure 10C:
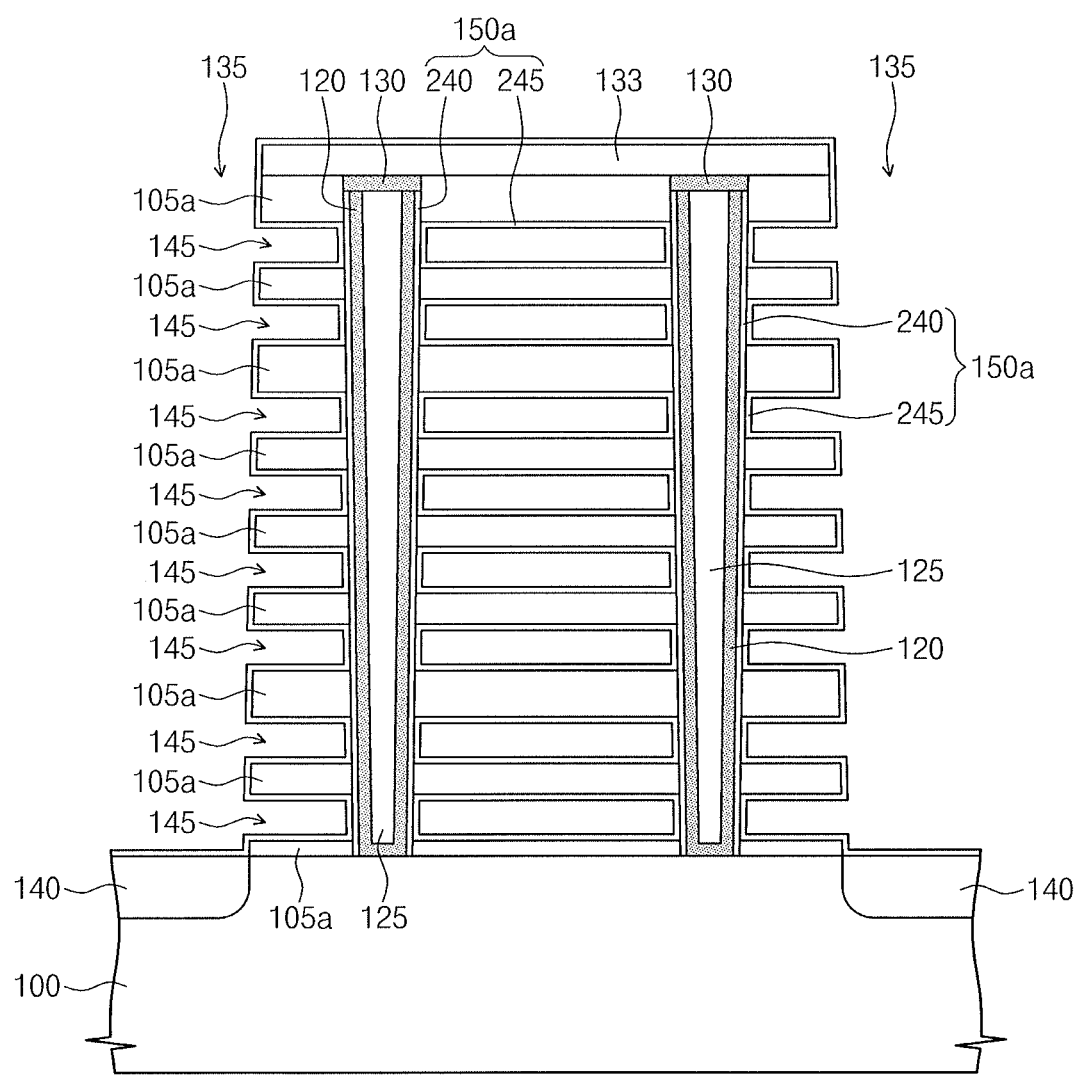

FIGS. 10A through 10C illustrate cross sectional views depicting a method of fabricating a three dimensional semiconductor memory device, according to yet another exemplary embodiment.

Referring to FIG. 10A, a first sub-layer 240 may be formed on a sidewall of each of the openings 115, and the vertical active pattern 120 may be formed on the first sub-layer 240 and in each of the opening s115. The vertical active pattern 120 may be in contact with the substrate 100. The filling insulating layer 125 may fill an inner space surrounded by the vertical active pattern 120.

In an embodiment, the first sub-layer 240 may be formed, e.g., conformally formed, on the substrate 100 having the openings 115. A first semiconductor layer may be formed, e.g., conformally formed, on the first sub-layer 240. The first semiconductor layer and the first sub-layer 240 may be anisotropically etched by an etch-back process until the substrate 100 is exposed. Thus, the first sub-layer 240 and a first semiconductor pattern of spacer shapes may be formed on the sidewall of the opening 115. Subsequently, a second semiconductor layer may be formed, e.g., conformally formed, on the substrate 100 and a filling insulating layer may be formed on the second semiconductor layer to fill the opening 115. The filling insulating layer and the second semiconductor layer may be planarized to form a second semiconductor pattern and the filling insulating pattern 125 in the opening 115. The first and second semiconductor patterns may be in contact with each other to constitute the vertical active pattern 120. The second semiconductor pattern may be in contact with the substrate 100.

Referring to FIG. 10B, the insulating layers 105 and the sacrificial layers 110 may be successively patterned to form device isolation trenches 135, insulating pattern 105a, and sacrificial patterns. A common source region 140 may be formed in the substrate 100 under the device isolation trench 135. The sacrificial patterns may be removed to form empty regions 145. The empty regions 145 may expose portions of the first sub-layer 240 on the sidewall of the vertical active pattern 120.

Referring to FIG. 10C, a second sub-layer 245 may be formed, e.g., conformally formed, on the substrate 100 having the empty regions 145. Thus, a multi-layered dielectric layer 150a including the first and second sub-layers 240 and 245 may be formed. The following processes may be performed using substantially the same manners as described with reference to FIGS. 6D through 6H. The following processes may be modified, e.g., as the processes described with reference to FIG. 7, FIG. 8, and/or FIGS. 9A through 9C.

The three dimensional semiconductor memory devices described above may be encapsulated using various packaging techniques. For example, the three dimensional semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the three dimensional semiconductor memory device according to one of the above embodiments is mounted may further include at least one semiconductor device. e.g., a controller, a memory device, a logic device, and/or a hybrid device.

Figure 11:
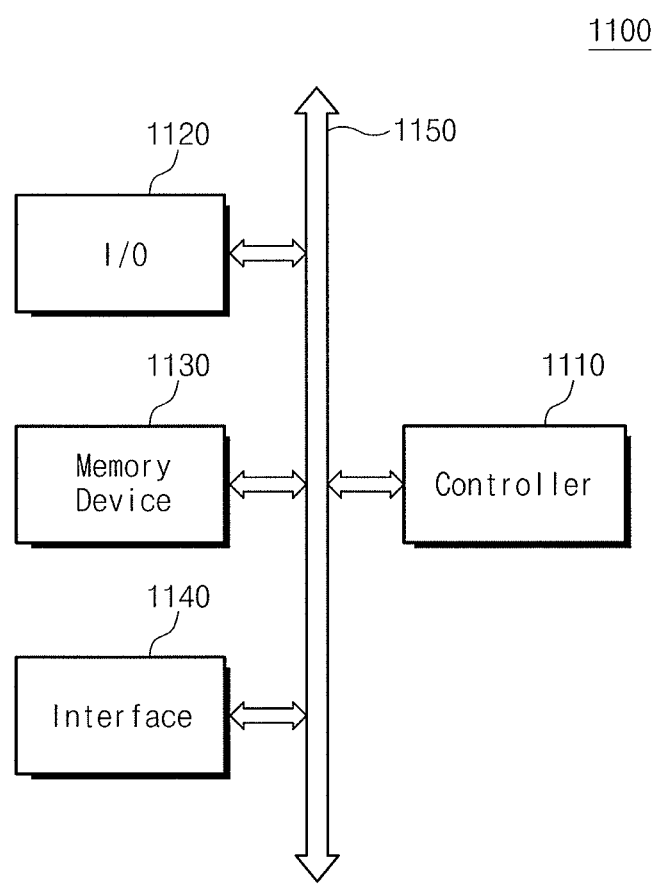
FIG. 11 illustrates a schematic block diagram of an electronic system including a three dimensional semiconductor memory device, according to an exemplary embodiment.

FIG. 11 illustrates a schematic block diagram of an example of electronic system including three dimensional semiconductor memory devices, according to an exemplary embodiment.

Referring to FIG. 11, an electronic system 1100, according to an exemplary embodiment, may include, e.g., a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and another logic device. The other logic device may have a similar function to any one of the microprocessor, the digital signal processor, and the microcontroller. The I/O unit 1120 may include a keypad, a keyboard, and/or a display unit. The memory device 1130 may store data and/or commands. The memory device 1130 may include at least one of the three dimensional semiconductor memory devices, e.g., according to the exemplary embodiments described above.

The memory device 1130 may further include other types of semiconductor memory devices that are different from the semiconductor devices described above. For example, the memory device 1130 may further include a non-volatile memory device (e.g. a magnetic memory device, a phase change memory device, etc), a dynamic random access memory (DRAM) device, and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for, e.g., improving an operation of the controller 1110.

The electronic system 1100 may be applied to a personal digital assistant (PDA), a portable computer, a web tablet, a wireless phone, a mobile phone, a digital music player, a memory card, and/or other electronic products. The other electronic products may receive or transmit information data by wireless.

Figure 12:
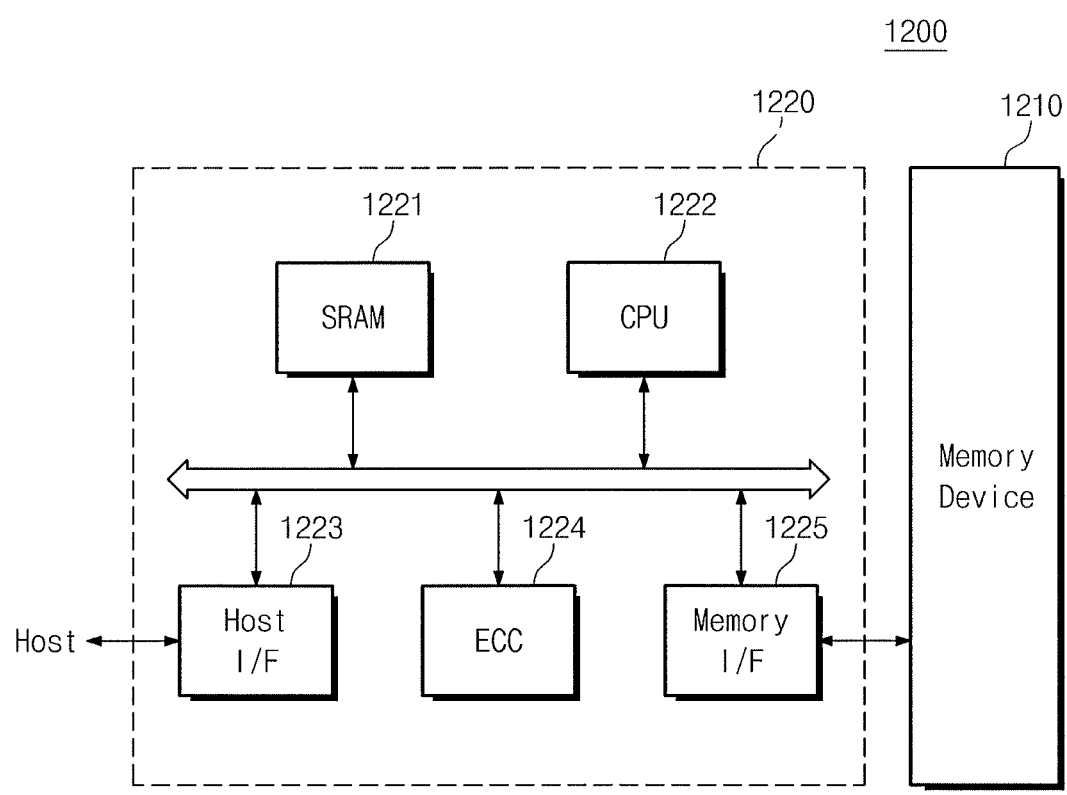
FIG. 12 illustrates a schematic block diagram of a memory card including a three dimensional memory device, according to an exemplary embodiment.

FIG. 12 illustrates a schematic block diagram of an example of a memory card including three dimensional memory devices, according to exemplary embodiment.

Referring to FIG. 12, a memory card 1200, according to an exemplary embodiment, may include a memory device 1210. The memory device 1210 may include at least one of the three dimensional semiconductor memory devices according to the embodiments mentioned above. In other embodiments, the memory device 1210 may further include another type of semiconductor memory devices that are different from the semiconductor devices according to the embodiments described above. For example, the memory device 1210 may further include a non-volatile memory device (e.g. a magnetic memory device, a phase change memory device, etc), a dynamic random access memory (DRAM) device and/or a static random access memory (SRAM) device.

The memory card 1200 may include a memory controller 1220 that controls data communication between a host and the memory device 1210. The memory controller 1220 may include a central processing unit (CPU) 1222 that controls, e.g., overall operations of the memory card 1200. The memory controller 1220 may include an SRAM device 1221 used, e.g., as an operation memory of the CPU 1222. The memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that, e.g., stores code data to interface with the host. The memory card 1200 may be used as a portable data storage card. Alternatively, the memory card 1200 may realized as solid state disks (SSD) that are used as hard disks of computer systems.

In the three dimensional semiconductor memory devices according to above embodiments, at least one of first and second supplement conductive patterns may be in contact with one sidewall of first and second string selection gates, respectively. Thus, resistance of the string selection gates may be minimized. As a result, the three dimensional semiconductor memory device with high reliability and high integration may be realized.

By way of summation and review, there has been a need to increase the integration density of semiconductor memory devices to store logic data. In two dimensional semiconductor memory devices, a planar area that a unit memory cell occupies may directly affect the integration density of the two dimensional semiconductor memory devices. That is, the integration density of the two dimensional semiconductor memory devices may be influenced by a minimum feature size that relates to a process technology for forming fine patterns. However, there may be limitations in improving the process technology for forming the fines patterns. In addition, high cost equipment or apparatus may be required to form the fine patterns. Thus, cost for fabricating the highly integrated two dimensional semiconductor memory devices may be increased.

Recently, three dimensional semiconductor memory devices have been proposed. The three dimensional semiconductor memory devices include a plurality of memory cells that are three dimensionally arrayed. Fabrication of the three dimensional semiconductor memory devices may have limitations, e.g., due to structural configurations thereof, that may degrade the reliability and/or electrical characteristics of the three dimensional semiconductor memory devices. Therefore, improvements are being sought.

The terminology used herein is for the purpose of describing particular embodiments only and is not intended to limit the embodiments. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Additionally, the embodiments in the detailed description have been described with sectional views as exemplary views. Accordingly, shapes of the exemplary views may be modified according to, e.g., manufacturing techniques and/or allowable errors. Therefore, the exemplary embodiments are not limited to the specific shape illustrated in the exemplary views, but may include other shapes that may be created according to, e.g., manufacturing processes. Areas exemplified in the drawings may have general properties, and may be used to illustrate exemplary specific shapes of elements. Thus, this should not be construed as limiting to the scope of the embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings. Exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are exemplary illustrations. Accordingly, variations from the shapes of the illustrations as a result, e.g., of manufacturing techniques and/or tolerances, are to be expected. Thus, exemplary embodiments should not be construed as limited to the shapes of regions illustrated herein but are to include deviations in shapes that result, e.g., from manufacturing. For example, an etching region illustrated as a rectangle may have rounded or curved features. Thus, the regions illustrated in the figures may be schematic in nature and their shapes may not illustrate the actual shape of a region of a device and should not be interpreted as limiting the scope of the exemplary embodiments.

Example embodiments have been disclosed herein, and although specific terms are employed, they are used and are to be interpreted in a generic and descriptive sense only and not for purpose of limitation. Therefore, it should be understood that the above embodiments are not limiting, but illustrative. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three dimensional semiconductor memory device, comprising:
a stacked structure including cell gates stacked therein that are insulated from each other and first string selection gates laterally separated from each other, the first string selection gates being disposed over an uppermost cell gate of the cell gates;
vertical active patterns extending through the first string selection gates, each vertical active pattern extending through each of the cell gates stacked under the first string selection gates;
multi-layered dielectric layers between sidewalls of the vertical active patterns and the cell gates and between the sidewalls of the vertical active patterns and the first string selection gates; and
at least one first supplement conductive pattern, the first supplement conductive pattern being in electrical contact with a sidewall of one of the first string selection gates and being spaced apart from the vertical active patterns by the first string selection gates therebetween.

2. The device as claimed in claim 1, wherein the first supplement conductive pattern includes a metal pattern and a barrier pattern between the metal pattern and the sidewall of the one of the first string selection gates.

3. The device as claimed in claim 1, wherein the sidewall of the one of the first string selection gates is laterally concave.

4. The device as claimed in claim 1, wherein a top end of the first supplement conductive pattern is at a level equal to or lower than a top surface of the one of the first string selection gates, and a bottom end of the first supplement conductive pattern is at a level equal to or higher than a bottom surface of the one of the first string selection gates.

5. The device as claimed in claim 1, further comprising:
a pair of device isolation patterns disposed at opposing sides of the stacked structure, wherein:
opposing sidewalls of each of the cell gates are in contact with respective ones of the pair of device isolation patterns, and
the sidewall of the one of the first string selection gates contacts the first supplement conductive pattern and an opposing sidewall of the one of the first string selection gates contacts one of the pair of device isolation patterns.

6. The device as claimed in claim 1, further comprising:
second string selection gates between the first string selection gates and the uppermost cell gate; and
at least one second supplement conductive pattern, the second supplement conductive pattern being in contact with a sidewall of one of the second string selection gates,
the vertical active patterns penetrating the first and second string selection gates,
the cell gates being stacked under the second string selection gates, and
the multi-layered dielectric layers being between the sidewalls of the vertical active patterns and the second string selection gates.

7. The device as claimed in claim 6, wherein a top end of the second supplement conductive pattern is at a level equal to or lower than a top surface of the one of the second string selection gates, and a bottom end of the second supplement conductive pattern is at a level equal to or higher than a bottom surface of the one of the second string selection gates.

8. The device as claimed in claim 6, wherein the first and second supplement conductive patterns are connected to each other and are insulated from other first and second supplement conductive patterns contacting neighboring ones of the first and second string selection gates.

9. The device as claimed in claim 1, wherein:
each of the multi-layered dielectric layers includes a tunnel dielectric layer, a charge storage layer, and a blocking dielectric layer, and portions of the multi-layered dielectric layers extend laterally to cover bottom and top surfaces of the cell gates and the first string selection gates.

10. The device as claimed in claim 1, wherein:
the stacked structure includes at least one ground selection gate between a substrate and a lowermost cell gate of the cell gates,
the vertical active patterns extend downwardly to penetrate the at least one ground selection gate,
the multi-layered dielectric layers are between the sidewalls of the vertical active patterns and the at least one ground selection gate.

11. A three dimensional semiconductor memory device, comprising:
a stacked structure including cell gates and string selection gates, the cell gates being stacked in a first direction and insulated from each other, and one of the string selection gates being spaced apart from another of the string selection gates in a second direction that intersects the first direction;
a cutting trench on the cell gates, the cutting trench being between the one of the string selection gates and the other of the string selection gates; and
first supplement conductive patterns, one of the first supplement conductive patterns being between a sidewall of the one of the string selection gates and the cutting trench and another of the first supplement conductive patterns being between a sidewall of the other of the string selection gates and the cutting trench.

12. The device as claimed in claim 11, wherein the first supplement conductive patterns are separated from each other.

13. The device as claimed in claim 11, further comprising vertical active patterns, one vertical active pattern extending through the one of the string selection gates and each of the cell gates and another vertical active pattern extending through the other of the string selection gates and each of the cell gates.

14. The device as claimed in claim 13, wherein the first supplement conductive patterns define portions of sidewalls of the cutting trench.

15. The device as claimed in claim 13, wherein the cutting trench exposes an insulating layer above an uppermost cell gate of the cell gates in the stacked structure such that a bottom surface of the cutting trench is defined by the insulating layer.

* * * * *